(12) United States Patent
Kirner et al.

(10) Patent No.: US 9,187,600 B2
(45) Date of Patent: Nov. 17, 2015

(54) POLYIMIDES AS DIELECTRIC

(75) Inventors: Hans Jürg Kirner, Basel (CH); Marcel Kastler, Basel (CH); Emmanuel Martin, Folgensbourg (FR)

(73) Assignee: BASF SE, Ludwigshafen (DE)

( * ) Notice: Subject to any disclaimer, the term of this patent is extended or adjusted under 35 U.S.C. 154(b) by 216 days.

(21) Appl. No.: 13/286,639

(22) Filed: Nov. 1, 2011

(65) Prior Publication Data

US 2012/0108740 A1    May 3, 2012

Related U.S. Application Data

(60) Provisional application No. 61/421,215, filed on Dec. 9, 2010, provisional application No. 61/408,683, filed on Nov. 1, 2010.

(51) Int. Cl.
| | |
|---|---|
| *H01G 4/18* | (2006.01) |
| *C08G 73/10* | (2006.01) |
| *H01L 51/00* | (2006.01) |
| *C09D 179/08* | (2006.01) |
| *H01L 51/50* | (2006.01) |

(52) U.S. Cl.
CPC .......... *C08G 73/101* (2013.01); *C08G 73/1025* (2013.01); *C09D 179/08* (2013.01); *H01L 51/006* (2013.01); *C08G 2261/92* (2013.01); *H01L 51/5012* (2013.01)

(58) Field of Classification Search
CPC . C07C 211/60; H01L 51/006; H01L 51/5012; H01L 51/0061; C08G 2261/92; C08G 2261/95; C08G 73/1071
USPC ...................... 430/690; 428/917; 549/43, 356; 528/170, 353; 361/311
See application file for complete search history.

(56) References Cited

U.S. PATENT DOCUMENTS

| | | | |
|---|---|---|---|
| 4,778,859 A | 10/1988 | Ai et al. | |
| 4,925,912 A | 5/1990 | Rohde et al. | |
| 5,317,082 A | 5/1994 | Beuhler et al. | |
| 5,449,742 A | 9/1995 | Beuhler et al. | |
| 6,066,696 A | 5/2000 | Yu et al. | |
| 6,451,459 B1 | 9/2002 | Tieke et al. | |
| 2002/0188075 A1* | 12/2002 | Park et al. | ..... 525/180 |
| 2008/0057446 A1* | 3/2008 | Goto et al. | ..... 430/327 |
| 2008/0293888 A1* | 11/2008 | Bachels et al. | ..... 525/200 |
| 2011/0240981 A1 | 10/2011 | Düggeli et al. | |

FOREIGN PATENT DOCUMENTS

| | | | |
|---|---|---|---|
| EP | 0 054 426 A2 | | 6/1982 |
| EP | 0 181 837 A2 | | 5/1986 |
| GB | WO99/48160 | * | 9/1999 |
| KR | 2008-0074417 | | 8/2008 |
| KR | 2010-0049999 | | 5/2010 |
| WO | WO 2005/049695 A1 | | 6/2005 |
| WO | WO 2008/000664 A1 | | 1/2008 |
| WO | WO 2010/049321 A1 | | 5/2010 |
| WO | WO 2010/049323 A1 | | 5/2010 |
| WO | WO 2010/053240 A1 | | 5/2010 |
| WO | WO 2010/108873 A1 | | 9/2010 |
| WO | WO 2010/115767 A1 | | 10/2010 |
| WO | WO 2010/136352 A1 | | 12/2010 |
| WO | WO 2010/136353 A1 | | 12/2010 |

OTHER PUBLICATIONS

International Search Report issued Jan. 13, 2012, in PCT/EP2011/068808.
Kazuo Takeuchi, et al., "Nano-integration: An ingenuity driven approach in nanotechnology", Riken Review, Focused on Nanotechnology in Riken II, vol. 38, XP 002624126, Aug. 2001, pp. 3-6.
U.S. Appl. No. 13/809,496, filed Jan. 10, 2013, Koehler, et al.
U.S. Appl. No. 14/384,208, filed Sep. 10, 2014, Kirner, et al.

* cited by examiner

*Primary Examiner* — Gregory Listvoyb
(74) *Attorney, Agent, or Firm* — Oblon, McClelland, Maier & Neustadt, L.L.P.

(57) ABSTRACT

The present invention provides a process for the preparation of a transistor on a substrate, which transistor comprises a layer, which layer comprises polyimide B, which process comprises the steps of
i) forming a layer comprising photocurable polyimide A by applying photocurable polyimide A on a layer of the transistor or on the substrate
ii) irradiating the layer comprising photocurable polyimide A with light of a wavelength of >=360 nm in order to form the layer comprising polyimide B,
and a transistor obtainable by that process.

10 Claims, 8 Drawing Sheets

POLYIMIDES AS DIELECTRIC

Figure 1:
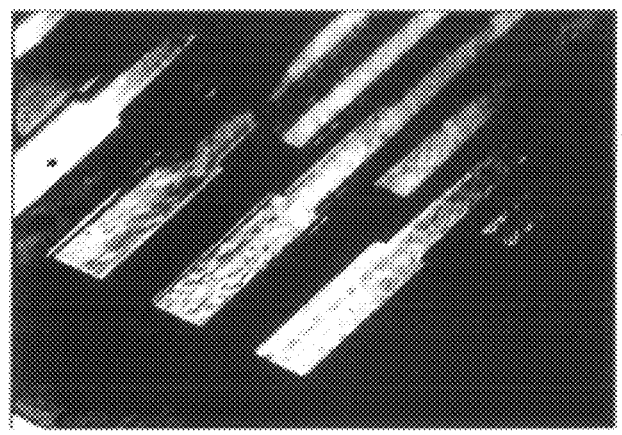

This application claims the benefit of U.S. application Ser. Nos. 61/421,215 filed Dec. 9, 2010 and 61/408,683 filed Nov. 1, 2010.

The present invention relates to a process for the preparation of a transistor on a substrate and to a transistor on a substrate obtainable by that process.

Transistors, and in particular organic field-effect transistors (OFETs), are used as components for organic light emitting display, e-paper, liquid crystal display and radiofrequency identification tags.

An organic field effect transistor (OFET) comprises a semiconducting layer comprising an organic semiconducting material, a dielectric layer comprising a dielectric material, a gate electrode and source/drain electrodes.

Organic field effect transistors (OFETs), wherein the dielectric material is an organic dielectric material, which can be applied by solution processing techniques, are de-sired. Solution processing techniques are convenient from the point of processability, and can also be applied to plastic substrates. Thus, organic dielectric materials, which are compatible with solution processing techniques, allow the production of low cost organic field effect transistors on flexible substrates.

Polyimides are suitable organic dielectric material for use in organic field effect transistors (OFET). Organic field effect transistors (OFET), wherein the dielectric material is a polyimide, are known in the art.

Kato, Y.; Iba, S.; Teramoto, R.; Sekitani, T.; Someya, T., Appl. Phys. Lett. 2004, 84(19), 3789 to 3791 describes a Bottom-Gate Bottom-Contact organic field-effect transistors (OFET) comprising a pentacene top layer (semiconducting layer), a polyimide layer (dielectric gate layer) and a polyethylenenapthalate (PEN) base film (substrate). The transistor is prepared using a process which comprises the following steps: (i) evaporating gate electrodes consisting of gold and chromium layers through a shadow mask on 125 μm thick PEN film in a vacuum system, (ii) spin-coating a polyimide precursor on the PEN base film and evaporating the solvent at 90° C., (iii) curing the polyimide precursor at 180° C. to obtain a polyimide gate dielectric layer, (iv) subliming pentacene through a shadow mask at ambient temperature on the polyimide gate dielectric layer, and (v) evaporating source-drain electrodes consisting of gold layers through a shadow mask. A transistor with a 990 nm polyimide gate dielectric layer shows a channel length (L) of 100 μm, a width (W) of 1.9 mm, an on/off ratio of $10^6$ (if the source drain current ($I_{DS}$) at gate voltage ($V_{GS}$) is 35 V) and a mobility of 0.3 cm$^2$/Vs. The leakage current density of capacitors comprising a 540 nm thick polyimide layer between two gold electrodes is less than 0.1 nA/cm$^2$ at 40 V and less than 1.1 nA/cm$^2$ at 100 V.

Lee, J. H.; Kim, J. Y.; Yi, M. H.; Ka, J. W.; Hwang, T. S.; Ahn, T. Mol. Cryst. Liq. Cryst. 2005, 519, 192-198 describes a Bottom-Gate Bottom-Contact organic field-effect transistor comprising a pentacene top layer (semiconducting layer), a cross-linked polyimide layer (dielectric gate layer) and glass (substrate). The transistor is prepared using a process which comprises the following steps: (i) patterning indium tin oxide of indium tin oxide coated glass as 2 mm wide stripes to obtain glass with indium tin oxide gate electrodes, (ii) spin-coating a solution of hydroxyl group containing polyimide (prepared by reacting 2,2-bis-(3,4-dicarboxyphenyl) hexafluoropropane dianhydride and 3,3'-dihydroxy-4,4'-diaminobiphenyl), trimethylolpropane triglycidyl ether, benzoyl peroxide and triphenylsulfonium triflate as photoacid in γ-butyrolactone on the glass with the indium tin oxide gate electrodes and evaporating the solvent at 100° C., (iii) crosslinking the hydroxyl group containing polyimide and trimethylolpropane triglycidyl ether by exposure to UV light followed by hardening at 160° C. for 30 minutes to obtain a 300 nm thick polyimide gate dielectric layer, (iv) depositing on top of the gate dielectric layer a 60 nm thick pentacene layer through a shadow mask using thermal evaporation at a pressure of $1 \times 10^{-6}$ torr, and (v) evaporating source-drain gold electrodes on top of the pentacene layer. The transistor so produced shows a channel length (L) of 50 μm, a width (W) of 1.0 mm, an on/off ratio of $1.55 \times 10^5$ and a mobility of 0.203 cm$^2$/Vs. The leakage current density of capacitors consisting of a 300 nm thick cross-linked polyimide layer between two gold electrodes is less than $2.33 \times 10^{-10}$ A/cm$^2$ at 3.3 A/cm$^2$ indicating that the dielectric layer is resistant to moisture and other environmental conditions.

Pyo, S.; Lee, M.; Jeon, J.; Lee, J. H.; Yi, M. H.; Kim, J. S. Adv. Funct. Mater. 2005, 15(4), 619 to 626 describes a Bottom-gate Bottom-contact organic field-effect transistor comprising a pentacene top layer (semiconducting layer), a patterned polyimide layer (prepared from 3,3',4,4'-benzophenone tetracarboxylic dianhydride (BTDA) and 7-(3, 5-diaminobenzoyloxy)coumarine) (dielectric gate layer) and glass (substrate). The transistor is prepared using a process which comprises the following steps: (i) depositing gold electrodes through a shadow mask by thermal evaporation on the glass substrate (ii) spin-coating the precursor of the polyimide (namely the poly(amic acid)) on top of the gate electrode and baking at 90° C. for 2 minutes, (iii) crosslinking parts of the poly(amic acid) film by irradiating with UV light at 280 to 310 nm through a mask followed by post-exposure baking at 160° C. for 19 minutes, (iv) removing the not cross-linked parts of the poly(amic acid) film by dipping into aqueous tetramethylammonium hydroxide solution followed by rinsing with water, (v) thermally converting the patterned crosslinked poly(amic acid) film obtained in step (iv) to a patterned polyimide layer (300 nm thick) by baking at 250° C. for 1 minute, (vi) depositing a 60 nm thick pentacene layer on top of the polyimide film through a shadow mask by thermal evaporation, and (vii) thermally evaporating gold source and drain electrodes on top of the pentacene layer through a shadow mask. The leakage current density of capacitors consisting of a polyimide layer between two gold electrodes is less than $1.4 \times 10^{-7}$ A/cm$^2$. The breakdown voltage of this gate insulator was more than 2 MV cm$^{-1}$. The capacitance of the film was found to be 129 pF/mm$^2$. The patterned polyimde layer allows the creation of access to the gate electrode.

KR 2008-0074417 A (application date: 9 Feb. 2007, inventors: Yi, M. H.; Taek, A.; Sun, Y. H.) describes a low temperature soluble mixture consisting of two polyimides, which mixture is suitable as insulating layer in transistors. In both polyimides the group R (which is the group carrying the four carboxylic acid functionalities forming the two imide groups) is at least one tetravalent group including a specific aliphatic cyclic tetravalent group. In the second polyimide the group $R^2$ (which is the group carrying the two amine functionalities forming the two imide groups) is at least a divalent group including a divalent aromatic group having a pendant alkyl group. Exemplified is, for example, a mixture consisting of polyimide SPI-3 (prepared from 1-(3,5-diaminophenyl)-3-octadecyl-succinic imide and 5-(2,5-dioxotetrahydrfuryl)-3-methylcyclohexane-1,2-dicarboxylic dianhydride) and polyimide SPI-1 (prepared from 4,4'-diamino diphenylmethane (or methylenedianiline) and 5-(2,5-dioxotetrahydrfuryl)-3-methylcaclohexane-1,2-dicarboxylic dianhydride) in γ-butyrolactone and cyclohexanone. A transistor is prepared using a process which comprises the following steps: (i) deposing a gate electrode through a mask, (ii) spin-coating a polyimide mixture and drying at 90° C., (ii) baking at 150° C., (iii) depositing pentacene by vacuum evaporation, (iv) depositing source-drain electrodes. As substrate glass and polyethersulfone is used.

Sim, K.; Choi, Y.; Kim, H.; Cho, S.; Yoon, S. C.; Pyo, S. *Organic Electronics* 2009, 10, 506-510 describes a bottom gate organic field-effect transistor comprising a 6,13-bis-(tri-isopropyl-silylethynyl)pentacene (TIPS pentacene) top layer (semiconducting layer), a low-temperature processable polyimide layer (prepared from 3,3',4,4'-benzophenone-tetracarboxylic dianhydride (BTDA) and 4,4'-diamino-3,3'-dimethyl-diphenylmethane (DADM))(dielectric gate layer) and glass (substrate). A transistor is prepared using a process which comprises the following steps: (i) photo-lithographically patterning indium tin oxide on a glass substrate, (ii) spin-coating a solution of BPDA-DADM polyimide in N-methylpyrrolidone (NMP) on top of the gate electrode, (iii) soft baking at 90° C. for 1 minute, (iv) further baking at 175° C. for 1 hour in vacuum, and (v) drop coating a solution of TIPS pentacene and a polymeric binder in o-dichloromethane on the BPDA-DADM polyimide layer, (vi) baking at 90° C. for 1 hour in vacuum, (vii) thermally evaporating 60 nm thick source and drain gold electrodes through a shadow mask. The transistor so produced shows a channel length (L) of 50 µm, a width (W) of 3 mm, an on/off ratio of $1.46 \times 10^6$ and a mobility of 0.15 cm$^2$/Vs.

Chou, W.-Y.; Kuo, C.-W.; Chang, C.-W.; Yeh, B.-L.; Chang, M.-H. *J. Mater. Chem.* 2010, 20, 5474 to 5480 describes a bottom gate organic field-effect transistor comprising a pentacene top layer (semiconducting layer), a photosensitive polyimide (prepared from 4,4'-oxydianiline (ODA), 4,4'-(1,3-phenylenedioxy)dianiline (TPE-Q), 4-(10,13-di-methyl-17-(6-methylheptan-2-yl)-2,3,4,7,8,9,10,11,12,13,14,15,16,17-tetradecahydro-1H-cyclopenta[a]phenanthren-3-yloxy)benzene-1,3-diamine (CHDA), pyromellitic dianhydride (PDMA), and cyclobutane-1,2,3,4-tetracarboxylic dianhydride (CBDA)) layer (dielectric gate layer), a silicium dioxide layer (dielectric gate layer) and heavily doped n-type silicium (111) wafer (gate and substrate). The photosensitive polyimide used only absorbs at a wavelength of 250 to 300 nm. The transistor is prepared using a process which comprises the following steps: (i) plasma-enhanced chemical vapour depositing a 300 nm thick silicium dioxide layer, (ii) spin-coating a 80 nm thick photosensitive polyimide layer on the silicium dioxide layer, (iii) baking (removing the solvent of) the photosensitive polyimide layer at 220° C. for 60 minutes, (iv) irradiating with UV light, (v) depositing a 70 nm thick pentacene layer onto the photosensitive polyimide layer at room temperature by vacuum sublimation, and (vi) depositing silver source-drain electrodes on the pentacene film through a shadow mask. The transistor so produced shows a channel length (L) of 120 µm, a width (W) of 1920 µm, an on/off ratio of $10^3$ to $10^5$ (depending on the UV dose applied) and an average mobility of 6.0 cm$^2$/Vs. The surface energy, surface carriers and capacitance of the polyimide gate dielectric can be tuned by varying irradiation doses of UV light on the photosensitive polyimide surface.

KR 2010-0049999 A (application date: 13. May 2010, inventors: Ahn, T.; Yi, M. H.; Kim, J. Y.) describes two soluble photocurable polyimides suitable for use as insulator in transistors. In both polyimides the group R (which is the group carrying the four carboxylic acid functionalities forming the two imide groups) is at least one tetravalent group including a specific aliphatic cyclic tetravalent group. In both polyimide the group $R^1$ (which is the group carrying the two amine functionalities forming the two imide groups) carries an optionally substituted photocurable cinnamoyl group. For example, the polyimide KPSPI-1 is prepared from 5-(2,5-dioxotetrahydrfuryl)-3-methylcyclohexane-1,2-dicarboxylic dianhydride and 3,3-dihydroxybenzidine, followed by reaction with cinnamoyl chloride. The polyimide layer can be prepared by (i) spin-coating a 9 weight % solution of the photocurable polyimide (KPSPI-1) in γ-butyrolactone and baking at 90° C. for 10 minutes, (iii) curing by UV irradiation (300 to 400 nm), (iii) hard-baking at 160° C. for 30 minutes. The leakage current density of capacitors consisting of the photocured polyimide layer (KPSPI-1) between two gold electrodes is $7.84 \times 10^{-11}$ A/cm$^2$. The breakdown voltage of KPSPI-1 is 3 MV cm$^{-1}$.

The disadvantage of above processes for the preparation of organic field effect transistors having a dielectric layer comprising a polyimide is that the formation of the dielectric layer requires temperatures of at least 150° C. These high temperatures are not compliable with all kinds of plastic substrates, for example these temperatures are not compliable with polycarbonate substrates, as polycarbonate has a glass temperature (Tg) of 150° C. and softens gradually above this temperature. However, polycarbonate is an ideal substrate for preparing thin and flexible organic field effect transistors.

Thus, it was the object of the present invention to provide a process for the preparation of a transistor on a substrate, preferably an organic field effect transistor, comprising a layer comprising polyimide, for example as dielectric layer, wherein the step of forming the layer comprising polyimide is performed at temperatures below 160° C., preferably below 150°, more preferably below 120° C.

This object is solved by the process of claim 1, and the transistor of claim 15.

The process of the present invention for the preparation of a transistor on a substrate, which transistor comprises a layer, which layer comprises polyimide B, comprises the steps of i) forming a layer comprising photocurable polyimide A by applying photocurable polyimide A on a layer of the transistor or on the substrate
ii) irradiating the layer comprising photocurable polyimide A with light of a wavelength of >=360 nm in order to form the layer comprising polyimide B.

Preferably, the process does not comprise a step of heat treatment at a temperature of >=160° C., More preferably, the process does not comprise a step of heat treatment at a temperature of >=150° C. Most preferably, the process does not comprise a step of heat treatment at a temperature of >=120° C.

Preferably, the layer comprising photocurable polyimide A is irradiated with light of a wavelength of >=360 nm and <=440 nm in order to form the layer comprising polyimide B. More preferably it is irradiated with light of a wavelength of 365 nm, 405 nm and/or 435 nm. Most preferably it is irradiated with light of 365 nm.

Preferably, the photocurable polyimide A is a photocurable polyimide, which carries (i) at least one photosensitive group, and (ii) at least one crosslinkable group.

The photosensitive group is a group that generates a radical by irradiation with light of a wavelength of >=360 nm, preferably with light of a wavelength of >=360 nm and <=440 nm, more preferably with light of a wavelength of 365 nm, 405 nm and/or 435 nm, most preferably with light of a wavelength of 365 nm.

The crosslinkable group is a group which is capable of generating a radical by reaction with the radical generated from the photosensitive group by irradiation with light of a wavelength of >=360 nm, preferably with light of a wavelength of >=360 nm and <=440 nm, more preferably with light of a wavelength of 365 nm, 405 nm and/or 435 nm, most preferably with light of a wavelength of 365 nm.

Preferably, the photocurable polyimide A is a polyimide which is obtainable by reacting a mixture of reactants, which mixture of reactants comprise at least one dianhydride A, and at least one diamine A, wherein (i) the dianhydride A is a dianhydride carrying at least one photosensitive group and the diamine A is a diamine carrying at least one crosslinkable group, (ii) the dianhydride A is a dianhydride carrying at least one crosslinkable group and the diamine A is an diamine carrying at least one photosensitive group, (iii) the dianhydride A is a dianhydride carrying at least one photosensitive group and at least one crosslinkable group, or (iv) the diamine A is a diamine carrying at least one photosensitive group and at least one crosslinkable group, wherein the photosensitive group and the crosslinkable group are as defined above.

The dianhydride A is an organic compound carrying two —C(O)—O—C(O)— functionalities.

The diamine A is an organic compound carrying two amino functionalities.

Preferably, the mixture of reactants are reacted in a suitable solvent, such as N-methylpyrrolidone, tetrahydrofuran or 1,4-dioxane, at a suitable temperature, for example at a temperature in the range of 10 to 150° C., or at a temperature in the range from 10 to 50° C., or at a temperature in the range from 18 to 30° C.

In a preferred embodiment, the photocurable polyimide A is a polyimide which is obtainable by reacting a mixture of reactants, which mixture of reactants comprise at least one dianhydrides A and at least one diamines A, wherein the dianhydride A is dianhydrides carrying at least one photosensitive group and the diamines A is a diamine carrying at least one crosslinkable group, wherein the photosensitive group and the crosslinkable group are as defined above.

Preferably, the dianhydride A, which is dianhydrides carrying at least one photosensitive group, is a benzophenone derivative carrying two —C(O)—O—C(O)— functionalities.

More preferably, the dianhydrides A, which is a dianhydrides carrying at least one photosensitive group, is a benzophenone derivative carrying two —C(O)—O—C(O)— functionalities, wherein the two —C(O)—O—C(O)— functionalities are directly attached to the same or to different phenyl rings of the benzophenone basic structure.

More preferably, the dianhydride A which is a dianhydride carrying at least one photosensitive group, is selected from the group consisting of

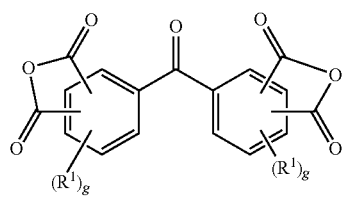

1

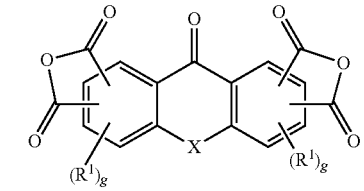

2

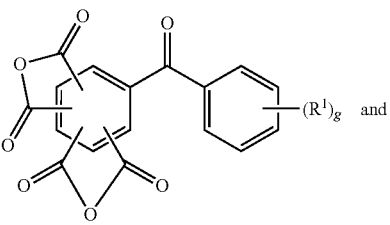

3 and

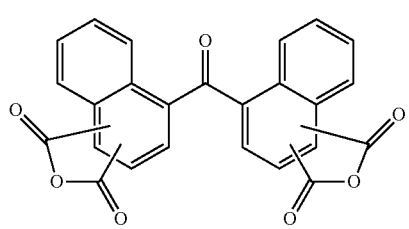

4 wherein
$R^1$ is $C_{1-10}$-alkyl, $C_{1-10}$-haloalkyl, halogen or phenyl
g is 0, 1, 2 or 3, preferably 0,
X is a direct bond, $CH_2$, O, S or C(O), preferably X is a direct bond, $CH_2$ or O.

Even more preferably, the dianhydride A which is a dianhydride carrying at least one photosensitive group, is selected from the group consisting of

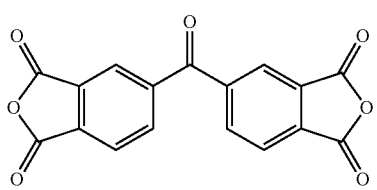

1a

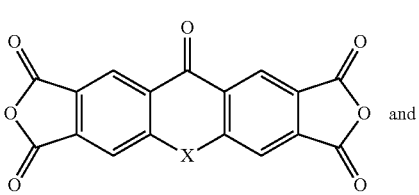

2a and

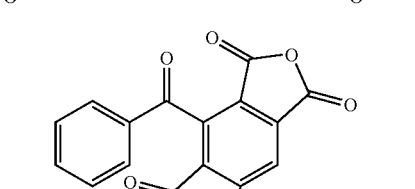

3a wherein X can be O, S and $CH_2$.

Examples of the dianhydride of formula (2a) are the dianhydrides of formulae

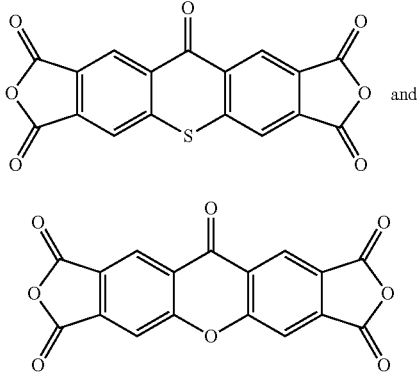

The most preferred dianhydride A, which is a dianhyride carrying at least one photosensitive group, is the dianhydride of formula

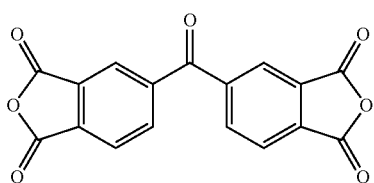

Dianhydrides of formulae (1), (2), (3) and (4) can either be prepared by methods known in the art or are commercially available. For example, dianhydride (2a1) can be prepared as described in EP 0 181 837, example b, dianhydride (2a2) can be prepared as described in EP 0 181 837 A2, example a. Dianhydride (1a) is commercially available.

Preferably, the diamine A, which is a diamine carrying at least one crosslinkable group, is an organic compound carrying (i) two amino functionalities,
and
(iia) at least one aromatic ring having attached at least one $CH_2$ or $CH_3$ group or
(iib) at least one carbon-to-carbon double bond having attached at least one H, or at least one $CH_2$ or $CH_3$ group.

Alternative (iia) is preferred to alternative (iib).

Examples of aromatic rings are phenyl and naphthyl. Phenyl is preferred.

More preferably the diamine A, which is a diamine carrying at least one crosslinkable group, is selected from the group consisting of
(i) a diamine of formula

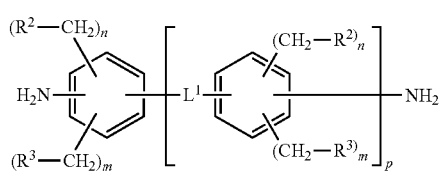

wherein $R^2$, $R^3$ are the same or different and are H, $C_{1-10}$-alkyl or $C_{4-8}$-cycloalkyl, n is 1, 2, 3 or 4 m is 0, 1, 2 or 3 provided n+m<=4, p is 0, 1, 2, 3 or 4, $L^1$ is O, S, $C_{1-10}$-alkylene, phenylene or C(O)

wherein $C_{1-10}$-alkylene can be optionally substituted with one or more $C_{1-10}$-alkyl, $C_{1-10}$-haloalkyl and/or $C_{4-8}$-cycloalkyl, or interrupted by O or S, (ii) a diamine of formula

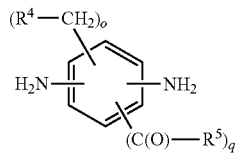

wherein $R^4$ is H, $C_{1-10}$-alkyl or $C_{4-8}$-cycloalkyl $R^5$ is O—$C_{1-10}$-alkyl, O—$C_{1-10}$-alkylene-O—$C_{1-10}$-alkyl, O—$C_{1-10}$-alkylene-N($C_{1-10}$-alkyl)$_2$, N($C_{1-10}$-alkyl)$_2$, O-phenyl, W, O—$C_{1-10}$-alkylene-W, O-phenylene-W, N($R^6$)($C_{1-10}$-alkylene-W) or N($R^6$)(phenylene-W), wherein $R^6$ is H, $C_{1-10}$-alkyl, $C_{4-10}$-cycloalkyl or $C_{1-10}$-alkylene-W, W is O—$C_{2-10}$-alkenyl, N($R^7$)($C_{2-10}$-alkenyl), O—C(O)—$CR^8$=$CH_2$, N($R^7$)(C(O)—$CR^8$=$CH_2$), or

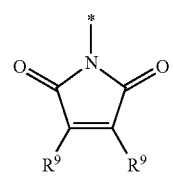

wherein $R^7$ is H, $C_{1-10}$-alkyl, $C_{4-8}$-cycloalkyl, $C_{2-10}$-alkenyl or C(O)—$CR^8$=$CH_2$, $R^8$ is H, $C_{1-10}$-alkyl or $C_{4-8}$-cycloalkyl, $R^9$ is H, $C_{1-10}$-alkyl or $C_{4-8}$-cycloalkyl q is 1, 2, 3 or 4 o is 0, 1, 2, 3 q+o<=4, in case o is 0, $R^5$ is W, O—$C_{1-10}$-alkylene-W, O-phenylene-W, N($R^8$)($C_{1-10}$-alkylene-W) or N($R^6$)(phenylene-W), wherein $C_{1-10}$-alkylene, can be optionally substituted with one or more $C_{1-10}$-alkyl, $C_{1-10}$-haloalkyl, and/or $C_{4-8}$-cycloalkyl, or interrupted by O or S,
and
(iii) a diamine of formula

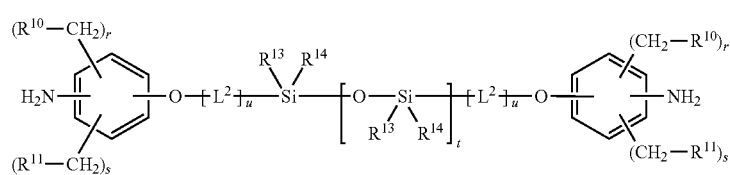

(8)

wherein
$R^{10}$ and $R^{11}$ are the same or different and are H, $C_{1-10}$-alkyl or $C_{4-8}$-cycloalkyl $R^{13}$ and $R^{14}$ are the same and different and are $C_{1-10}$-alkyl, $C_{1-10}$-haloalkyl, $C_{4-8}$-cycloalkyl, phenyl, $C_{2-10}$-alkenyl or $C_{4-10}$-cycloalkenyl, $L^2$ is $C_{1-10}$-alkylene or phenylene r is 0, 1, 2, 3 or 4 s is 0, 1, 2, 3 or 4 r+s<=4 in case both r and s are 0 then at least one of $R^{13}$ and $R^{14}$ is $C_{2-10}$-alkenyl or $C_{4-10}$-cycloalkenyl, t is 0, 1, 2, 3, 4 or 5 u is 0 or 1 wherein $C_{1-10}$-alkylene can be optionally substituted with one or more $C_{1-10}$-alkyl, $C_{1-10}$-haloalkyl and/or $C_{4-8}$-cycloalkyl, or $C_{1-10}$-alkylene can be optionally interrupted by O or S.

Examples of halogen are fluoro, chloro and bromo.

Examples of $C_{1-10}$-alkyl are methyl, ethyl, propyl, isopropyl, butyl, sec-butyl, isobutyl, tert-butyl, pentyl, 2-ethylbutyl, hexyl, heptyl, octyl, nonyl and decyl. Examples of $C_{1-4}$-alkyl are methyl, ethyl, propyl, isopropyl, butyl, sec-butyl, isobutyl and tert-butyl.

Examples of $C_{4-8}$-cycloalkyl are cyclobutyl, cyclopentyl, cyclohexyl, cycloheptyl and cyclooctyl.

Examples of $C_{1-10}$-haloalkyl are trifluoromethyl and pentafluoroethyl.

Examples of $C_{2-10}$-alkenyl are vinyl, $CH_2$—CH=$CH_2$, $CH_2$—$CH_2$—CH=$CH_2$.

Examples of $C_{4-10}$-cycloalkenyl are cyclopentyl, cyclohexyl and norbornenyl.

Examples of $C_{1-10}$-alkylene are methylene, ethylene, propylene, butylene, pentylene, hexylene and heptylene. Examples of $C_{1-4}$-alkylene are methylene, ethylene, propylene and butylene Examples of $C_{4-8}$-cycloalkylene are cyclobutylene, cyclopentylene, cyclohexylene and cycloheptylene.

Examples of $C_{1-4}$-alkanoic acid are acetic acid, propionic acid and butyric acid.

The diamine of formula (5) is preferred to the diamines of formulae (6) and (8).

Preferred diamines of formula (5) are diamines of formula

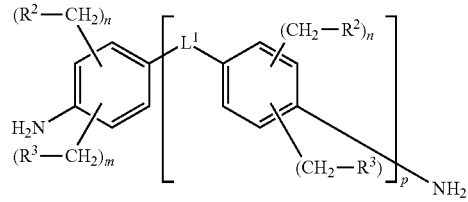

(5a)

wherein
$R^2$, $R^3$ are the same or different and are H, $C_{1-10}$-alkyl or $C_{4-8}$-cycloalkyl, n is 1, 2, 3 or 4 m is 0, 1, 2 or 3 provided n+m<=4, p is 0, 1, 2, 3 or 4, $L^1$ is O, S, $C_{1-10}$-alkylene, phenylene or C(O)

wherein $C_{1-10}$-alkylene can be optionally substituted with one or more $C_{1-10}$-alkyl, $C_{1-10}$-haloalkyl and/or $C_{4-8}$-cycloalkyl, or interrupted by O or S.

Examples of diamines of formula (5a) are

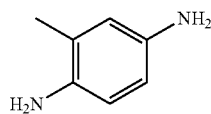

5a1

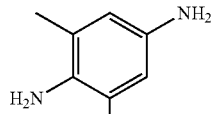

5a2

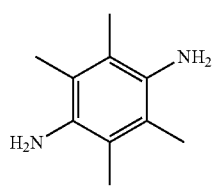

5a3

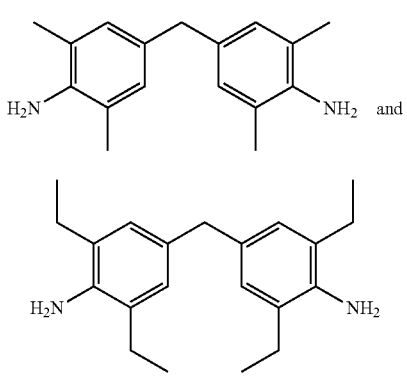

In preferred diamines of formula (5a)
$R^2$, $R^3$ are the same or different and are H, $C_{1-10}$-alkyl or $C_{4-8}$-cycloalkyl, n is 1, 2, 3 m is 0, 1, 2 provided n+m=2, 3 or 4 p is 0, 1, 2, 3 or 4, $L^1$ is O, S or $C_{1-10}$-alkylene wherein $C_{1-10}$-alkylene can be optionally substituted with one or more $C_{1-10}$-alkyl, $C_{1-10}$-haloalkyl and/or $C_{4-8}$-cycloalkyl.

In more preferred diamines of formula (5a)
$R^2$, $R^3$ are the same or different and are $C_{1-10}$-alkyl or $C_{4-8}$-cycloalkyl, n is 1, 2, m is 0, 1, provided n+m=2 p is 1, $L^1$ is O or $C_{1-10}$-alkylene.

In even more preferred diamines of formula (5a)
$R^2$ is $C_{1-4}$alkyl, n is 2, p is 1, $L^1$ is O or $C_{1-4}$-alkylene.

The most preferred diamines of formula (5a) is the diamine of formula

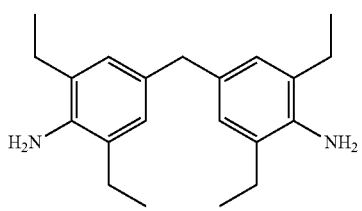

The diamines of formula (5) are either commercially available or can be prepared by methods known in the art, for example as described for the diamine of formula (5a4) in Oleinik, I. I.; Oleinik, I. V.; Ivanchev, S. S.; Tolstikov, G. G. *Russian J. Org. Chem.* 2009, 45, 4, 528 to 535.

A preferred diamine of formula (6) is a diamine of formula

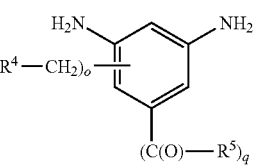

(6a)

wherein
$R^4$ is H, $C_{1-10}$-alkyl or $C_{4-8}$-cycloalkyl $R^5$ is O—$C_{1-10}$-alkyl, O—$C_{1-10}$-alkylene-O—$C_{1-10}$-alkyl, O—$C_{1-10}$-alkylene-N($C_{1-10}$-alkyl)$_2$, N($C_{1-10}$-alkyl)$_2$, O-phenyl, W, O—$C_{1-10}$-alkylene-W, O-phenylene-W, N($R^6$)($C_{1-10}$-alkylene-W) or N($R^6$)(phenylene-W), wherein
$R^6$ is H, $C_{1-10}$-alkyl, $C_{4-8}$-cycloalkyl or $C_{1-10}$-alkylene-W,
W is O—$C_{2-10}$-alkenyl, N($R^7$)($C_{2-10}$-alkenyl), O—C(O)—$CR^8$=CH$_2$, N($R^7$)(C(O)—$CR^8$=CH$_2$), or

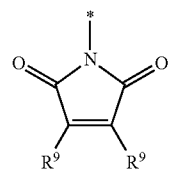

(7)

wherein
$R^7$ is H, $C_{1-10}$-alkyl, $C_{4-8}$-cycloalkyl, $C_{2-10}$-alkenyl or C(O)—$CR^8$=CH$_2$, $R^8$ is H, $C_{1-10}$-alkyl or $C_{4-8}$-cycloalkyl, $R^9$ is H, $C_{1-10}$-alkyl or $C_{4-8}$-cycloalkyl q is 1, 2, 3 or 4 o is 0, 1, 2, 3 q+o<=4, in case o is 0, $R^5$ is W, O—$C_{1-10}$-alkylene-W, O-phenylene-W, N($R^6$)($C_{1-10}$-alkylene-W) or N($R^6$)(phenylene-W), wherein $C_{1-10}$-alkylene, can be optionally substituted with one or more $C_{1-10}$-alkyl, $C_{1-10}$-haloalkyl, and/or $C_{4-8}$-cycloalkyl, or interrupted by O or S.

In preferred diamines of formula 6a o is 0

$R^5$ is W, O—$C_{1-10}$-alkylene-W, O-phenylene-W, N($R^6$)($C_{1-10}$-alkylene-W) or N($R^6$)(phenylene-W), wherein
$R^6$ is H, $C_{1-10}$-alkyl, $C_{4-10}$-cycloalkyl or $C_{1-10}$-alkylene-W,
W is O—$C_{2-10}$-alkenyl, N($R^7$)($C_{2-10}$-alkenyl), O—C(O)—$CR^8$=CH$_2$,
N($R^7$)(C(O)—$CR^8$=CH$_2$), or

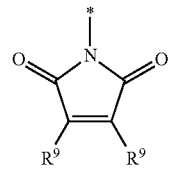

(7)

wherein
$R^7$ is H, $C_{1-10}$-alkyl, $C_{4-8}$cycloalkyl, $C_{2-10}$-alkenyl or C(O)—$CR^8$=CH$_2$, $R^8$ is H, $C_{1-10}$-alkyl or $C_{4-8}$-cycloalkyl,
$R^9$ is H, $C_{1-10}$-alkyl or $C_{4-8}$-cycloalkyl
q is 1 or 2
wherein $C_{1-10}$-alkylene, can be optionally substituted with one or more $C_{1-10}$-alkyl, $C_{1-10}$-haloalkyl, and/or $C_{4-8}$-cycloalkyl, or interrupted by O or S.

In more preferred diamines of formula 6a
o is 0
$R^5$ is O—$C_{1-10}$-alkylene-W or O-phenylene-W
  wherein
  W is O—$C_{2-10}$-alkenyl, $N(R^7)(C_{2-10}$-alkenyl), O—C(O)—$CR^8$=$CH_2$, $N(R^7)(C(O)$—$CR^8$=$CH_2)$, or

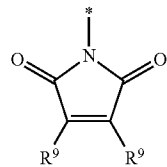

(7)

wherein
  $R^7$ is H, $C_{1-10}$-alkyl, $C_{4-8}$-cycloalkyl, $C_{2-10}$-alkenyl or C(O)—$CR^8$=$CH_2$,
  $R^8$ is H, $C_{1-10}$-alkyl or $C_{4-8}$-cycloalkyl,
  $R^9$ is $C_{1-10}$-alkyl,
q is 1
wherein $C_{1-10}$-alkylene, can be optionally substituted with one or more $C_{1-10}$-alkyl, $C_{1-10}$-haloalkyl, and/or $C_{4-8}$-cycloalkyl, or interrupted by O or S.

In most preferred diamines of formula 6a
o is 0
$R^5$ is O—$C_{1-10}$-alkylene-W or O-phenylene-W
  wherein
  W is

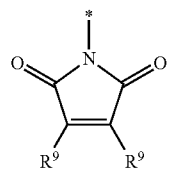

(7)

wherein
  $R^9$ is methyl,
q is 1
wherein $C_{1-10}$-alkylene, can be optionally substituted with one or more $C_{1-10}$-alkyl, $C_{1-10}$-haloalkyl, and/or $C_{4-8}$-cycloalkyl, or interrupted by O or S.

The most preferred diamine of formula 6a are the diamines of formulae

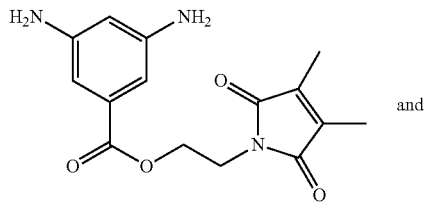

6a1 and

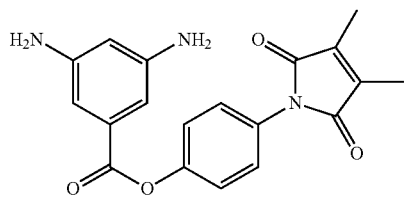

6a2

The diamines of formula (6) are either commercially available or can be prepared by methods known in the art. For example, the diamine of formula (6) can be prepared by reacting a dinitrocompound of formula (17) with H—$R^5$, followed by reduction of the nitro groups.

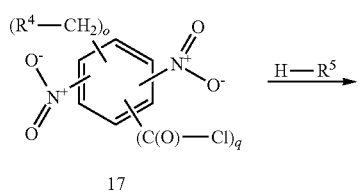

17

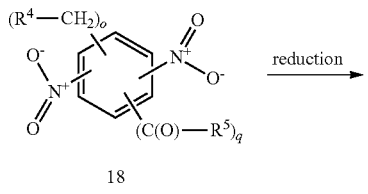

18

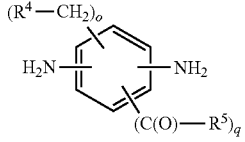

6

A preferred diamine of formula (8) is the diamine of formula

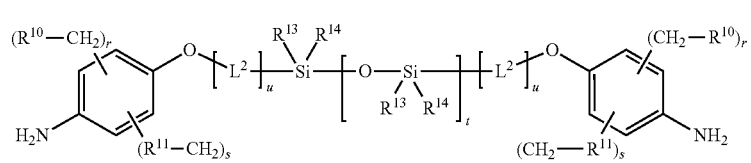

(8a)

wherein
R$^{10}$ and R$^{11}$ are the same or different and are H, C$_{1-10}$-alkyl or C$_{4-8}$-cycloalkyl
R$^{13}$ and R$^{14}$ are the same and different and are C$_{1-10}$-alkyl, C$_{1-10}$-haloalkyl, C$_{4-8}$-cycloalkyl, C$_{2-10}$-alkenyl, C$_{4-10}$-cycloalkenyl or phenyl, L$^2$ is C$_{1-10}$-alkylene or phenylene
r is 0, 1, 2, 3 or 4
s is 0, 1, 2, 3 or 4
r+s<=4
in case both r and s are 0 then at least one of R$^{13}$ and R$^{14}$ is C$_{2-10}$-alkenyl or C$_{4-10}$-cycloalkenyl,
t is 0 or an integer from 0 to 50, preferably 0 or an integer from 0 to 25, more preferably 0 or an integer from 1 to 6, most preferably 0 or 1,
u is 0 or 1
wherein C$_{1-10}$-alkylene, can be optionally substituted with one or more C$_{1-10}$-alkyl, C$_{1-10}$-haloalkyl, and/or C$_{4-8}$-cycloalkyl, or interrupted by O or S.

Preferred diamines of formula (8a) are diamines of formulae

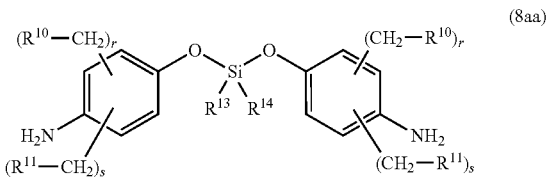

(8aa)

wherein
R$^{10}$ and R$^{11}$ are the same or different and are H, C$_{1-10}$-alkyl or C$_{4-8}$-cycloalkyl R$^{13}$ and R$^{14}$ are the same and different and are C$_{1-10}$-alkyl, C$_{4-8}$-cycloalkyl, C$_{2-10}$-alkenyl, C$_{4-10}$-cycloalkenyl or phenyl,
r is 0, 1, 2, 3 or 4
s is 0, 1, 2, 3 or 4
r+s<=4
in case both r and s are 0 then at least one of R$^{13}$ and R$^{14}$ is C$_{2-10}$-alkenyl or C$_{4-10}$-cycloalkenyl,
and

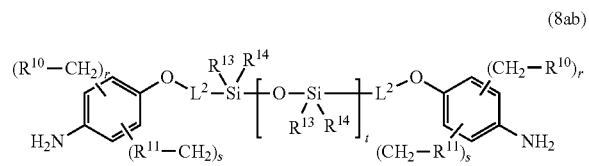

(8ab)

wherein
R$^{10}$ and R$^{11}$ are the same or different and are H, C$_{1-10}$-alkyl or C$_{4-8}$-cycloalkyl
R$^{13}$ and R$^{14}$ are the same and different and are C$_{1-10}$-alkyl, C$_{4-8}$-cycloalkyl, C$_{2-10}$-alkenyl, C$_{4-10}$-cycloalkenyl or phenyl L$^2$ is C$_{1-10}$-alkylene
r is 0, 1, 2, 3 or 4
s is 0, 1, 2, 3 or 4
r+s<=4
in case both r and s are 0 then at least one of R$^{13}$ and R$^{14}$ is C$_{2-10}$-alkenyl or C$_{4-10}$-cycloalkenyl,
t is 0 or an integer from 0 to 50, preferably 0 or an integer from 0 to 25, more preferably 0 or an integer from 1 to 6, most preferably 0 or 1,
wherein C$_{1-10}$-alkylene, can be optionally substituted with one or more C$_{1-10}$-alkyl, C$_{1-10}$-haloalkyl, and/or C$_{4-8}$-cycloalkyl, or interrupted by O or S.

Examples of diamines of formula (8aa) are

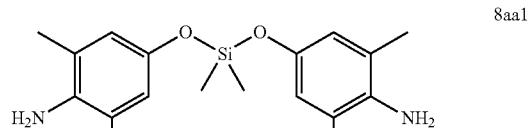

8aa1

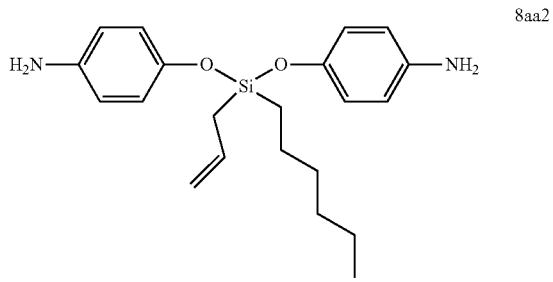

8aa2

An example of a diamine of formula (8ab) is the diamine of formula

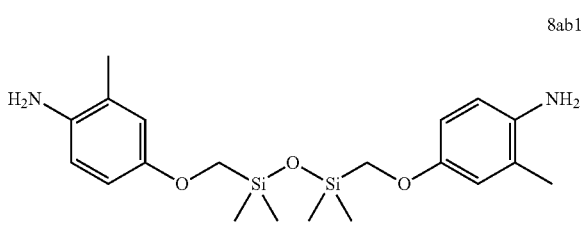 [SMILES: Cc1cc(OC[Si](C)(C)O[Si](C)(C)COc2ccc(N)c(C)c2)ccc1N]

8ab1

Diamines of formula (8) are either commercially available or can be prepared by methods known in the art, for example diamines of formula (8aa) can be prepared as described by Ismail, R. M. *Helv. Chim. Acta* 1964, 47, 2405 to 2410, examples 12 to 14, for example diamines of formula (8ab) can be prepared as described in EP 0 054 426 A2, for example in examples XXVI and XXVIII.

The mixture of reactants can comprise at least one dianhydride B and/or at least one diamine B, wherein the dianhydride B can be any dianhydride B different from dianhydride A and the diamine B can be any diamine B different from diamine A.

The dianhydride B is an organic compound carrying two —C(O)—O—C(O)— functionalities.

The diamine B is an organic compound carrying two amino functionalities.

In case the photocurable polyimide A is a polyimide which is obtainable by reacting a mixture of reactants, which mixture of reactants comprise at least one dianhydride A and at least one diamine A, wherein the dianhydride A is a dianhyride carrying at least one photosensitive group and the diamine A is a diamine carrying at least one crosslinkable group, the dianhydride B is a dianhydride carrying no photosensitive group, and the diamine B is a diamine carrying no crosslinkable group, wherein the photosensitive group and the crosslinkable group are as defined above.

Preferably, dianhydride B, which is a dianhydride carrying no photosensitive group, is an organic compound containing at least one aromatic ring and carrying two —C(O)—O—C(O)— functionalities, wherein the two —C(O)—O—C(O)— functionalities are attached to the same or different aromatic rings.

More preferably, the dianhydride B, which is a dianhydride carrying no photosensitive group, is selected from the group consisting of

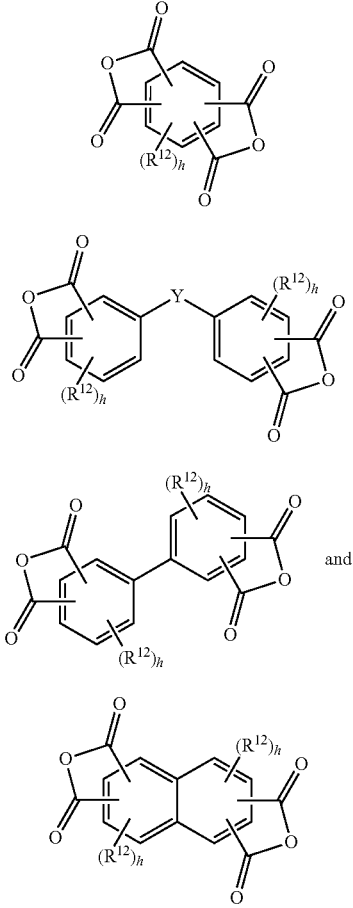

wherein $R^{12}$ is $C_{1-10}$-alkyl, $C_{1-10}$-haloalkyl, halogen or phenyl h is 0, 1, 2 or 3, preferably 0, Y is a $C_{1-10}$-alkylene, O or S, preferably Y is $CH_2$ or O.

Even more preferably, the dianhydride B, which is a dianhydride carrying no photosensitive group, is selected from the group consisting of

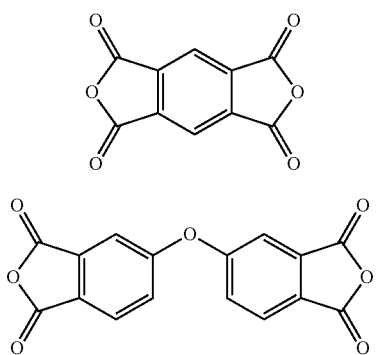

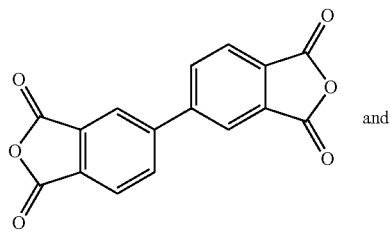

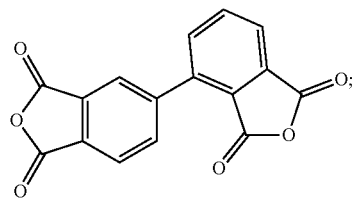

Most preferably, the dianhydride B, which is a dianhydride carrying no photosensitive group, is

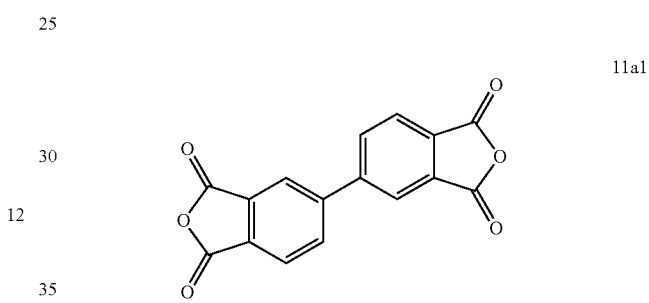

The dianhydride B of formulae (9) to (12) are either commercially available or can be prepared by methods known in the art, for example by treatment of the corresponding tetramethyl derivative with $HNO_3$ at 180° C.

The diamine B, which is a diamine carrying no crosslinkable group, can be selected from the group consisting of (i) a diamine of formula

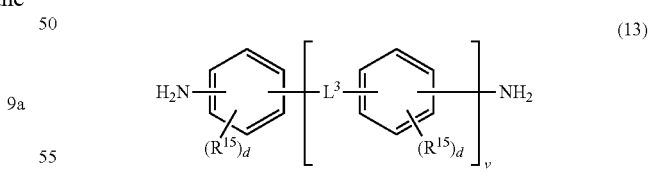

wherein $R^{15}$ is halogen or O—$C_{1-10}$-alkyl, d is 0, 1, 2, 3 or 4 v is 0, 1, 2, 3 or 4, $L^3$ is a direct bond, O, S, $C_{1-10}$-alkylene or CO, wherein $C_{1-10}$-alkylene can be optionally substituted with one or more $C_{1-10}$-alkyl, $C_{1-10}$-haloalkyl and/or $C_{4-8}$-cycloalkyl, or interrupted by O or S, (ii) a diamine of formula

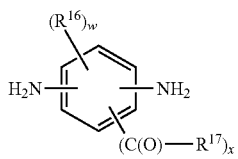

(14)

wherein
$R^{16}$ is halogen or O—$C_{1-10}$-alkyl
$R^{17}$ is O—$C_{1-10}$-alkyl, O—$C_{1-10}$-alkylene-O—$C_{1-10}$-alkyl, O-phenyl, O—$C_{1-10}$-alkylene-N($C_{1-10}$-alkyl)$_2$ or N($C_{1-10}$-alkyl)$_2$
w is 0, 1, 2 or 3
x is 1, 2, 3, 4
w+x<=4,
wherein $C_{1-10}$-alkylene can be optionally substituted with one or more $C_{1-10}$-alkyl, $C_{1-10}$-haloalkyl and/or $C_{4-8}$-cycloalkyl, or interrupted by O or S,
(iii) a diamine of formula

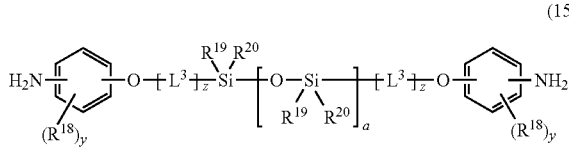

(15)

wherein
$R^{18}$ is halogen or O—$C_{1-10}$-alkyl,
$R^{19}$ and $R^{20}$ are the same and different and are $C_{1-10}$-alkyl, $C_{1-10}$-haloalkyl or $C_{4-8}$-cycloalkyl or phenyl,
$L^3$ is $C_{1-10}$-alkylene or phenylene
y is 0, 1, 2, 3 or 4
z is 0 or 1
a is 0 or an integer from 1 to 50, preferably 0 or an integer from 1 to 25,
wherein $C_{1-10}$-alkylene can be optionally substituted with one or more $C_{1-10}$-alkyl, $C_{1-10}$-haloalkyl and/or $C_{4-8}$-cycloalkyl, or interrupted by O or S,
and
(iv) a diamine of formula

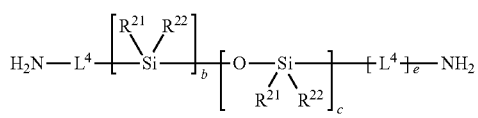

(16)

wherein
$R^{21}$ and $R^{22}$ are the same and different and are $C_{1-10}$-alkyl, $C_{1-10}$-haloalkyl or $C_{4-8}$-cycloalkyl,
$L^4$ is $C_{1-10}$-alkylene, $C_{4-8}$-cycloalkylene or $C_{4-8}$-cycloalkylene-Z—$C_{4-8}$-cycloalkylene,
wherein Z is $C_{1-10}$-alkylene, S, O or CO
b is 0 or 1
c is 0 or an integer from 1 to 50, preferably, 0 or an integer from 1 to 25, more preferably 0 or an integer from 1 to 6, most preferably 0 or 1 e is 0 or 1
wherein $C_{1-10}$-alkylene can be optionally substituted with one or more $C_{1-10}$-alkyl, $C_{1-10}$-haloalkyl and/or $C_{4-8}$-cycloalkyl, or interrupted by O or S.

Preferably, diamine B, which is a diamine carrying no crosslinkable group, is a diamine of formula (14) or (16).

A preferred diamine of formula (13) a diamine of formula

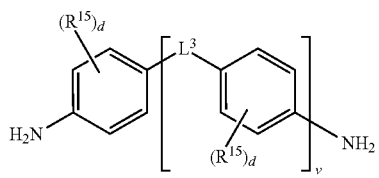

(13a)

wherein
$R^{15}$ is halogen or O—$C_{1-10}$-alkyl,
d is 0, 1, 2, 3 or 4
v is 0, 1, 2, 3 or 4,
$L^3$ is a direct bond, O, S, $C_{1-10}$-alkylene or CO,
wherein $C_{1-10}$-alkylene can be optionally substituted with one or more $C_{1-10}$-alkyl, $C_{1-10}$-haloalkyl and/or $C_{4-8}$-cycloalkyl, or interrupted by O or S.

Examples of diamines of formula 13a are

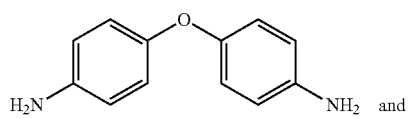

13a1 and

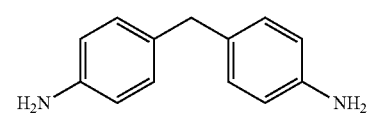

13a2

In preferred diamines of formula (13a)
d is 0, 1 or 2
v is 1
$L^3$ is O or $C_{1-10}$-alkylene,
wherein $C_{1-10}$-alkylene can be optionally substituted with one or more $C_{1-10}$-alkyl, $C_{1-10}$-haloalkyl and/or $C_{4-8}$-cycloalkyl, or interrupted by O.

In more preferred diamines of formula (13a)
d is 0
v is 1
$L^3$ is O or methylene,
wherein methylene can be optionally substituted with one or more $C_{1-10}$-alkyl, $C_{1-10}$-haloalkyl and/or $C_{4-8}$-cycloalkyl.

The diamines of formula (13) are either commercially available or can be prepared by methods known in the art, for example as described in Ingold, C. K.; Kidd, H. V. *J. Chem. Soc.* 1933, 984 to 988.

A preferred diamine of formula (14) is the diamine of formula $$\text{(14a)}$$

H₂N—[benzene ring with (R¹⁶)_w and (C(O)—R¹⁷)_x substituents]—NH₂ wherein
R¹⁶ is halogen or O—C_{1-10}-alkyl
R¹⁷ is O—C_{1-10}-alkyl, O—C_{1-10}-alkylene-O—C_{1-10}-alkyl, O-phenyl, O—C_{1-10}-alkylene-N(C_{1-10}-alkyl)₂ or N(C_{1-10}-alkyl)₂
w is 0, 1, 2 or 3
x is 1, 2, 3, 4
w+x<=4,
wherein C_{1-10}-alkylene can be optionally substituted with one or more C_{1-10}-alkyl, C_{1-10}-haloalkyl and/or C_{4-8}-cycloalkyl, or interrupted by O or S.

Examples of diamines of formula (14a) are

14a1

14a2

14a3

In preferred diamines of formula (14a)
R¹⁶ is halogen or O—C_{1-10}-alkyl
R¹⁷ is O—C_{1-10}-alkyl, O—C_{1-10}-alkylene-O—C_{1-10}-alkyl or O-phenyl
w is 0, 1, 2 or 3
x is 1.

In more preferred diamines of formula (14a)
R¹⁶ is halogen or O—C_{1-10}-alkyl
R¹⁷ is O—C_{1-10}-alkyl
w is 0, 1 or 2
x is 1.

The most preferred diamines of formula (14a) is the diamine of formula

14a3

The diamines of formula (14) are either commercially available or can be prepared by methods known in the art.

For example, the diamine of formula (14) can be prepared by reacting a dinitrocompound of formula (19) with H—R¹⁷, followed by reduction of the nitro groups.

19

$$\xrightarrow{H-R^5}$$

20

$$\xrightarrow{\text{reduction}}$$

14

Preferred diamines of formula (15) are diamines of formula (15a)

wherein $R^{18}$ is halogen or O—$C_{1-10}$-alkyl, $R^{19}$ and $R^{20}$ are the same and different and are $C_{1-10}$-alkyl, $C_{1-10}$-haloalkyl or $C_{4-8}$-cycloalkyl or phenyl, $L^3$ is $C_{1-10}$-alkylene or phenylene y is 0, 1, 2, 3 or 4 z is 0 or 1 a is 0 or an integer from 1 to 50, preferably 0 or an integer from 1 to 25, wherein $C_{1-10}$-alkylene can be optionally substituted with one or more $C_{1-10}$-alkyl, $C_{1-10}$-haloalkyl and/or $C_{4-8}$-cycloalkyl, or interrupted by O or S.

Preferred diamines of formula (15a) are the diamines of formulae

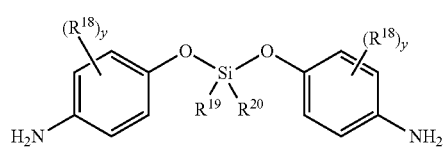
(15aa)

wherein $R^{18}$ is halogen or O—$C_{1-10}$-alkyl, $R^{19}$ and $R^{20}$ are the same and different and are $C_{1-10}$-alkyl, $C_{4-8}$-cycloalkyl or phenyl, y is 0, 1, 2, 3 or 4 and

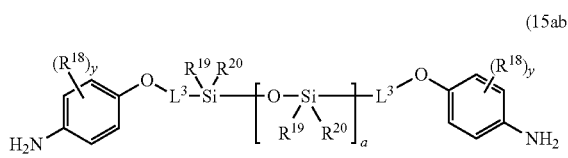
(15ab)

wherein $R^{18}$ is halogen or O—$C_{1-10}$-alkyl, $R^{19}$ and $R^{20}$ are the same and different and are $C_{1-10}$-alkyl, $C_{4-8}$-cyclobutyl or phenyl $L^3$ is $C_{1-10}$-alkylene or phenylene, a is 0 or an integer from 1 to 50, preferably 0 or an integer from 1 to 25, wherein $C_{1-10}$-alkylene can be optionally substituted with one or more $C_{1-10}$-alkyl, $C_{1-10}$-haloalkyl and/or $C_{4-8}$-cycloalkyl, or interrupted by O or S.

Examples of diamines of formula (15aa) are

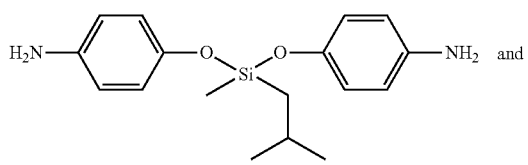
15aa1 and

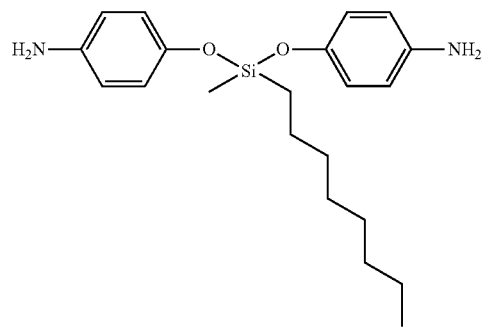
15aa2

An example of a diamine of formula (15ab) is

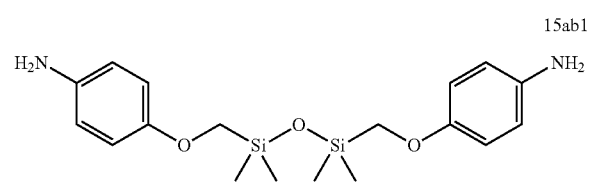 [SMILES: C[Si](C)(COc1ccc(N)cc1)O[Si](C)(C)COc1ccc(N)cc1]
15ab1

Diamines of formula (15) are either commercially available or can be prepared by methods known in the art, for example diamines of formula (15aa) can be prepared as described by Ismail, R. M. Helv. Chim. Acta 1964, 47, 2405 to 2410, examples 12 to 14, for example diamines of formula (15ab) can be prepared as described in EP 0 054 426 A2, for example in examples XXVI and XXVIII.

Preferred diamines of formula (16) are the diamines of formulae

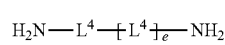
(16a)

wherein e is 0

$L^4$ is $C_{1-10}$-alkylene, $C_{4-8}$-cycloalkylene or $C_{4-8}$-cycloalkylene-Z—$C_{4-8}$-cycloalkylene, wherein Z is a direct bond, $C_{1-10}$-alkylene or O, wherein $C_{1-10}$-alkylene can be optionally substituted with one or more $C_{1-10}$-alkyl, $C_{1-10}$-haloalkyl and/or $C_{4-8}$-cycloalkyl, or interrupted by O or S.

and

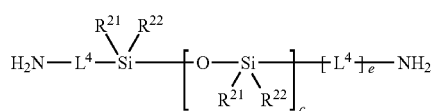
(16b)

wherein $R^{21}$ and $R^{22}$ are the same and different and are $C_{1-10}$-alkyl, $L^4$ is $C_{1-10}$-alkylene, $C_{4-8}$-cycloalkylene or $C_{4-8}$-cycloalkylene-Z—$C_{4-8}$-cycloalkylene, wherein Z is $C_{1-10}$-alkylene or O, e is 1 c is 0 or an integer from 1 to 50, preferably, 0 or an integer from 1 to 25, more preferably 0 or an integer from 1 to 6, most preferably 0 or 1, wherein $C_{1-10}$-alkylene can be optionally substituted with one or more $C_{1-10}$-alkyl, $C_{1-10}$-haloalkyl and/or $C_{4-8}$-cycloalkyl, or interrupted by O or S.

An example of a diamine of formula (16a) is

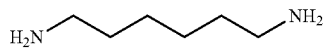
(16a1)

Examples of diamines of formula (16b) are

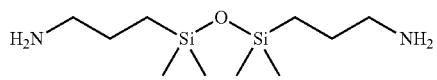
16b1

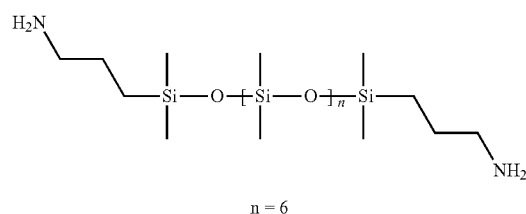
16b2 n = 6

In preferred diamines of formula (16a)
e is 0
$L^4$ is $C_{1-4}$-alkylene, which $C_{1-4}$-alkylene can be optionally substituted with one or more $C_{1-10}$-alkyl, $C_{1-10}$-haloalkyl and/or $C_{4-8}$-cycloalkyl.

In more preferred diamines of formula (16a)
e is 0
$L^4$ is $C_{1-4}$-alkylene.

The most preferred diamine of formula (16a) is

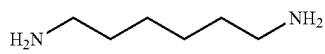
(16a1)

In preferred diamines of formula (16b)
e is 1
$R^{21}$ and $R^{22}$ are the same and different and are $C_{1-10}$-alkyl,
$L^4$ is $C_{1-10}$-alkylene,
c is 0 or an integer from 1 to 6
wherein $C_{1-10}$-alkylene can be optionally substituted with one or more $C_{1-10}$-alkyl, $C_{1-10}$-haloalkyl and/or $C_{4-8}$-cycloalkyl, or interrupted by O or S.

In more preferred diamines of formula (16b) wherein
e is 1
$R^{21}$ and $R^{22}$ are the same and different and are $C_{1-4}$-alkyl
$L^4$ is $C_{1-4}$-alkylene
c is 0 or 1
wherein $C_{1-10}$-alkylene can be optionally substituted with one or more $C_{1-10}$-alkyl, $C_{1-10}$-haloalkyl and/or $C_{4-8}$-cycloalkyl, or interrupted by —O—.

In most preferred diamines of formula (16b) the diamine of formula
e is 1
$R^{21}$ and $R^{22}$ are the same and different and are $C_{1-4}$-alkyl
$L^4$ is $C_{1-4}$-alkylene
c is 1

The most preferred diamine of formula (16b) is the diamine of formula

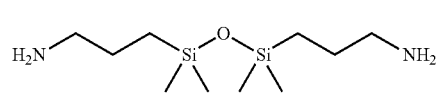
16b1

Diamines of formula (16) are either commercially available or can be prepared by methods known in the art, for example the diamine of formula (16b1) is commercially available.

The mixture of reactants can comprise at least one dianhydride C and/or at least one diamine C, wherein the dianhydride C can be any dianhydride different from dianhydride A and dianhydride B, and the diamine C can be any diamine different from diamine A and diamine B.

The dianhydride C is an organic compound carrying two —C(O)—O—C(O)— functionalities.

Preferably, dianhydride C is an organic compound containing at least one aromatic ring and carrying two —C(O)—O—C(O)— functionalities, wherein the two —C(O)—O—C(O)— functionalities are attached to the same or different aromatic rings.

The diamine C is an organic compound carrying two amino functionalities.

Preferably, the mixture of reactants does not comprise a dianhydride, which is an organic compound carrying two —C(O)—O—C(O)— functionalities, wherein the two —C(O)—O—C(O)— functionalities are attached to an aliphatic residue.

Examples of aliphatic residues are alicyclic rings, alkyl or alkylene residue.

Examples of alicyclic rings are $C_{4-8}$-cycloalkyl, $C_{4-10}$-cycloalkenyl and $C_{4-8}$-cycloalkylene. Examples of alkyl are $C_{1-10}$-alkyl. Examples of alkylene are $C_{1-10}$-alkylene.

In particular, the mixture of reactants does not comprise a dianhydride selected from the group consisting of

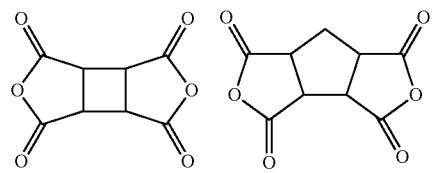

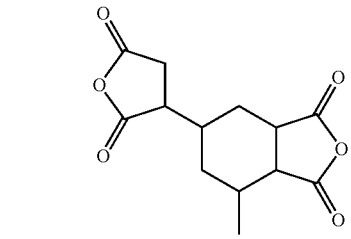

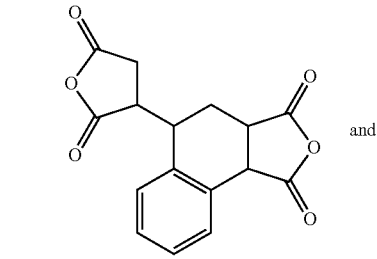
and

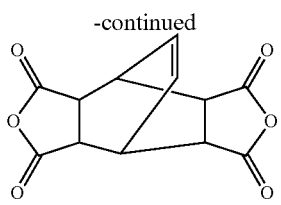

Preferably the mixture of reactants does not comprise a diamine carrying one or more-substituents of formulae

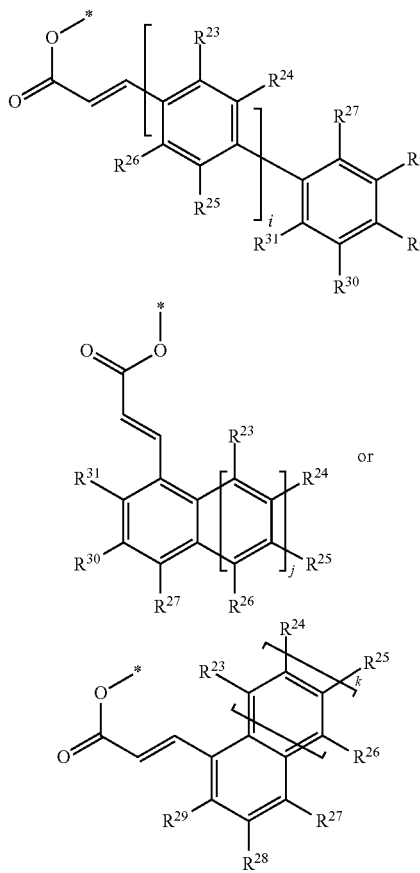

wherein $R^{23}$ to $R^{31}$ are the same or different and are independently H, $C_{1-10}$-alkyl, CN or halogen, and i, j and k are the same or different and are 0 or an integer from 1 to 10.

The mixture of reactants can comprise
from 0.1 to 100% by mol of all dianhydride A based on the sum of moles of all dianhydrides A and B and C
from 0 to 99% by mol of all dianhydride B based on the sum of moles of all dianhydrides A and B and C
from 0 to 99% by mol of all dianhydride C based on the sum of moles of all dianhydrides A and B and C
from 0.1 to 100% by mol of all diamine A based on the sum of moles of all diamines A and B and C
from 0 to 99% by mol of all diamine B based on the sum of moles of all diamines A and B and C
from 0 to 99% by mol of all diamine C based on the sum of moles of all diamines A and B and C,
wherein molar ratio of (dianhydride A and dianhydride B and dianhydride C)/(diamine A and diamine B and diamine C) is in the range of 150/100 to 100/150, preferably, in the range of 130/100 to 100/70, more preferably in the range of 120/100 to 100/80, and most preferably, in the range of 110/100 to 100/90.

Preferably, the mixture of reactants comprises
from 20 to 100% by mol of all dianhydride A based on the sum of moles of all dianhydrides A and B and C
from 0 to 80% by mol of all dianhydride B based on the sum of moles of all dianhydrides A and B and C
from 0 to 80%, by mol of all dianhydride C based on the sum of moles of all dianhydrides A and B and C
from 20 to 100%, by mol of all diamine A based on the sum of moles of all diamines A and B and C
from 0 to 80% by mol of all diamine B based on the sum of moles of all diamines A and B and C
from 0 to 80% by mol of all diamine C based on the sum of moles of all diamines A and B and C,
wherein molar ratio of (dianhydride A and dianhydride B and dianhydride C)/(diamine A and diamine B and diamine C) is in the range of 130/100 to 100/70, more preferably in the range of 120/100 to 100/80, and most preferably, in the range of 110/100 to 100/90.

The mixture of reactants can essentially consist of
from 0.1 to 100% by mol of all dianhydride A based on the sum of moles of all dianhydrides A and B and C
from 0 to 99% by mol of all dianhydride B based on the sum of moles of all dianhydrides A and B and C
from 0 to 99% by mol of all dianhydride C based on the sum of moles of all dianhydrides A and B and C
from 0.1 to 100% by mol of all diamine A based on the sum of moles of all diamines A and B and C
from 0 to 99% by mol of all diamine B based on the sum of moles of all diamines A and B and C
from 0 to 99% by mol of all diamine C based on the sum of moles of all diamines A and B and C,
wherein molar ratio of (dianhydride A and dianhydride B and dianhydride C)/(diamine A and diamine B and diamine C) is in the range of 150/100 to 100/150, preferably, in the range of 130/100 to 100/70, more preferably in the range of 120/100 to 100/80, and most preferably, in the range of 110/100 to 100/90.

Preferably, the mixture of reactants essentially consists of
from 20 to 100% by mol of all dianhydride A based on the sum of moles of all dianhydrides A and B and C
from 0 to 80% by mol of all dianhydride B based on the sum of moles of all dianhydrides A and B and C
from 0 to 80%, by mol of all dianhydride C based on the sum of moles of all dianhydrides A and B and C
from 20 to 100%, by mol of all diamine A based on the sum of moles of all diamines A and B and C
from 0 to 80% by mol of all diamine B based on the sum of moles of all diamines A and B and C
from 0 to 80% by mol of all diamine C based on the sum of moles of all diamines A and B and C,
wherein molar ratio of (dianhydride A and dianhydride B and dianhydride C)/(diamine A and diamine B and diamine C) is in the range of 130/100 to 100/70, more preferably in the range of 120/100 to 100/80, and most preferably, in the range of 110/100 to 100/90.

The glass temperature of the photocurable polyimide A is preferably above 150° C., more preferably above 170° C., and more preferably between 170° C. and 300° C.

The molecular weight of the photocurable polyimide A can be in the range of 5,000 to 1,000,000 g/mol, preferably, in the range of 5,000 to 40,000 g/mol, most preferably in the range of 5'000 to 20'000 g/mol.

Preferably, photocurable polyimide A is applied as a solution in an organic solvent A on the layer of the transistor or on the substrate.

The organic solvent A can be any solvent (or solvent mixture) that can dissolve at least 2% by weight, preferably at least 5% by weight, more preferably, at least 8% by weight of the photocurable polyimide A based on the weight of the solution of photocurable polyimide A.

The organic solvent A can be any solvent (or solvent mixture) that has a boiling point (at ambient pressure) of below 180° C., preferably below 150° C., more preferably below 130° C.

Preferably, the organic solvent A is selected from the group consisting of N-methylpyrrolidone, $C_{4-8}$-cycloalkanone, $C_{1-4}$-alkyl-C(O)—$C_{1-4}$-alkyl, $C_{1-4}$-alkanoic acid $C_{1-4}$-alkyl ester, wherein the $C_{1-4}$-alkyl or the $C_{1-4}$-alkanoic acid can be substituted by hydroxyl or O—$C_{1-4}$-alkyl, and $C_{1-4}$-alkyl-O—$C_{1-4}$-alkylene-O—$C_{1-4}$-alkylene-O—$C_{1-4}$-alkyl, and mixtures thereof.

Examples of $C_{4-8}$-cycloalkanone are cyclopentanone and cyclohexanone.

Examples of $C_{1-4}$-alkyl-C(O)—$C_{1-4}$-alkyl are ethyl isopropyl ketone, methyl ethyl ketone and methyl isobutyl ketone.

Examples of $C_{1-4}$-alkanoic acid $C_{1-4}$-alkyl ester, wherein the $C_{1-4}$-alkyl or the $C_{1-4}$-alkanoic acid can be substituted by hydroxyl or O—$C_{1-4}$-alkyl, are ethyl acetate, butyl acetate, isobutyl acetate, (2-methoxy)ethyl acetate, (2-methoxy)propyl acetate and ethyl lactate.

An example of $C_{1-4}$-alkyl-O—$C_{1-4}$-alkylene-O—$C_{1-4}$-alkylene-O—$C_{1-4}$-alkyl is diethylenegly-coldimethylether.

More preferably, the organic solvent A is selected from the group consisting of $C_{4-8}$-cycloalkanone, $C_{1-4}$-alkyl-C(O)—$C_{1-4}$-alkyl, $C_{1-4}$-alkanoic acid $C_{1-4}$-alkyl ester, wherein the $C_{1-4}$-alkyl or the $C_{1-4}$-alkanoic acid can be substituted by hydroxyl or O—$C_{1-4}$-alkyl, and $C_{1-4}$-alkyl-O—$C_{1-4}$-alkylene-O—$C_{1-4}$-alkylene-O—$C_{1-4}$-alkyl, and mixtures thereof.

Most preferably, the organic solvent A is selected from the group consisting of $C_{5-6}$-cycloalkanone, $C_{1-4}$-alkanoic acid $C_{1-4}$-alkyl ester, and mixtures thereof. Even most preferably the organic solvent A is cyclopentanone or butyl acetate or mixtures thereof. In particular preferred organic solvents A are butyl acetate or mixtures of butyl acetate and pentanone, wherein the weight ratio of butyl acetate/cyclopentanone is at least from 99/1 to 20/80, more preferably from 99/1 to 30/70.

If the photocurable polyimide A is applied as a solution in an organic solvent A on the layer of the transistor or on the substrate, the photocurable polyimide A can be applied by any possible solution process, such as spin-coating, drop-casting or printing.

After applying photocurable polyimide A as a solution in an organic solvent A on the layer of the transistor or on the substrate, a heat treatment at a temperature of below 140° C., for example at a temperature in the range of 60 to 120° C., preferably at a temperature of below 120° C., for example in the range of 60 to 110° C. can be performed.

The layer comprising photocurable polyimide A can have a thickness in the range of 100 to 1000 nm, preferably, in the range of 300 to 1000 nm, more preferably 300 to 700 nm.

The layer comprising photocurable polyimide A can comprise from 50 to 100% by weight, preferably from 80 to 100%, preferably 90 to 100% by weight of photocurable polyimide A based on the weight of the layer comprising photocurable polyimide A. Preferably, the layer comprising photocurable polyimide A essentially consists of photocurable polyimide A.

The layer comprising photocurable polyimide A can be irradiated with any suitable light source providing light of a wavelength of >=360 nm, for example with an LED lamp, in order to form the layer comprising polyimide B.

The layer comprising polyimide B can comprise from 50 to 100% by weight, preferably from 80 to 100%, preferably 90 to 100% by weight of polyimide B based on the weight of the layer comprising polyimide B. Preferably, the layer comprising polyimide B essentially consists of polyimide B.

The layer comprising photocurable polyimide B can have a thickness in the range of 100 to 1000 nm, preferably, in the range of 300 to 1000 nm, more preferably 300 to 700 nm.

The irradiation of the layer comprising photocurable polyimide A with light of a wavelength of >=360 nm in order to form the layer comprising polyimide B can be performed on only part of the layer comprising photocurable polyimide A, for example by using a mask.

If the irradiation of the layer comprising photocurable polyimide A with light of a wavelength of >=360 nm in order to form the layer comprising polyimide B is performed on only part of the layer comprising photocurable polyimide A, the non-irradiated part of the polyimide can be removed by dissolving it in an organic solvent B, leaving behind a patterned layer comprising polyimide B.

The organic solvent B can be any solvent (or solvent mixture) that can dissolve at least 2% by weight, preferably at least 5% by weight, more preferably, at least 8% by weight of the photocurable polyimide A based on the weight of the solution of photocurable polyimide A.

The organic solvent B can be any solvent (or solvent mixture) that has a boiling point (at ambient pressure) of below 180° C., preferably below 150° C., more preferably below 130° C.

Preferably, the organic solvent B is selected from the group consisting of N-methylpyrrolidone, $C_{4-8}$-cycloalkanone, $C_{1-4}$-alkyl-C(O)—$C_{1-4}$-alkyl, $C_{1-4}$-alkanoic acid $C_{1-4}$-alkyl ester, wherein the $C_{1-4}$-alkyl or the $C_{1-4}$-alkanoic acid can be substituted by hydroxyl or O—$C_{1-4}$-alkyl, and $C_{1-4}$-alkyl-O—$C_{1-4}$-alkylene-O—$C_{1-4}$-alkylene-O—$C_{1-4}$-alkyl, and mixtures thereof.

After dissolving the non-irradiated part of photocurable polyimide A in an organic solvent B, a heat treatment at a temperature of below 140° C., for example at a temperature in the range of 60 to 120° C., preferably at a temperature of below 120° C., for example in the range of 60 to 110° C. can be performed.

The transistor on a substrate is preferably a field-effect transistor (FET) on a substrate and more preferably an organic field-effect transistor (OFET) on a substrate.

Usually, an organic field effect transistor comprises a dielectric layer and a semiconducting layer. In addition, on organic field effect transistor usually comprises a gate electrode and source/drain electrodes.

An organic field effect transistor on a substrate can have various designs.

The most common design of a field-effect transistor on a substrate is the Bottom-Gate Bottom-Contact (BGBC) design. Here, the gate is on top of the substrate and at the bottom of the dielectric layer, the semiconducting layer is at the top of the dielectric layer and the source/drain electrodes are on top of the semiconducting layer.

Another design of a field-effect transistor on a substrate is the Top-Gate Bottom-Contact (TGBC) design. Here, the source/drain electrodes are on top of the substrate and at the bottom of the semiconducting layer, the dielectric layer is on top of the di-semiconducting layer and the gate electrode is on top of the dielectric layer.

The semiconducting layer comprises a semiconducting material. Examples of semiconducting materials are semiconducting materials having p-type conductivity (carrier: holes) and semiconducting materials having n-type conductivity (carrier: electrons).

Examples of semiconductors having n-type conductivity are perylenediimides, naphtalenediimides and fullerenes.

Semiconducting materials having p-type conductivity are preferred. Examples of semiconducting materials having p-type conductivity are molecules such as rubrene, tetracene, pentacene, 6,13-bis(triisopropylethynyl)pentacene, diindenoperylene, perylenediimide and tetracyanoquinodimethane, and polymers such as polythiophenes, in particular poly 3-hexylthiophene (P3HT), polyfluorene, polydiacetylene, poly 2,5-thienylene vinylene, poly p-phenylene vinylene (PPV) and polymers comprising repeating units having a diketopyrrolopyrrole group (DPP polymers).

Preferably the semiconducting material is a polymer comprising units having a diketopyrrolopyrrole group (DPP polymer).

Examples of DPP polymers and their synthesis are, for example, described in U.S. Pat. No. 6,451,459 B1, WO 2005/049695, WO 2008/000664, WO 2010/049321, WO 2010/049323, WO 2010/108873, WO 2010/115767, WO 2010/136353 and WO 2010/136352.

Preferably, the DPP polymer comprises, preferably essentially consists, of a unit selected from the group consisting of a polymer unit of formula

 (20)

a copolymer unit of formula

 (21)

a copolymer unit of formula

 (22)

and
a copolymer unit of formula

 (23)

wherein
n' is 4 to 1000, preferably 4 to 200, more preferably 5 to 100,
x' is 0.995 to 0.005, preferably x' is 0.2 to 0.8,
y' is 0.005 to 0.995, preferably y' is 0.8 to 0.2, and
x'+y'=1;
r' is 0.985 to 0.005,
s' is 0.005 to 0.985,
t' is 0.005 to 0.985,
u' is 0.005 to 0.985, and
r'+s'+t'+u'=1;
A is a group of formula

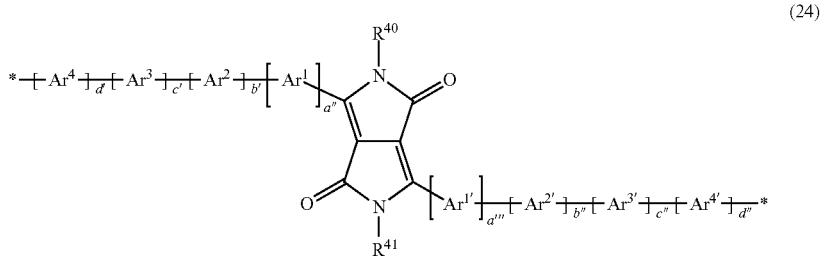 (24)

wherein
a" is 1, 2, or 3,
a'" is 0, 1, 2, or 3,
b' is 0, 1, 2, or 3,
b" is 0, 1, 2, or 3,
c' is 0, 1, 2, or 3,
c" is 0, 1, 2, or 3,
d' is 0, 1, 2, or 3,
d" is 0, 1, 2, or 3,
with the proviso that b" is not 0, if a'" is 0;
$R^{40}$ and $R^{41}$ are the same or different and are selected from the group consisting of hydrogen, $C_1$-$C_{100}$alkyl, —COOR$^{106''}$, $C_1$-$C_{100}$alkyl which is substituted with one or more halogen, hydroxyl, nitro, —CN, or $C_6$-$C_{18}$aryl and/or interrupted by —O—, —COO—, —OCO—, or —S—; $C_7$-$C_{100}$arylalkyl, carbamoyl, $C_5$-$C_{12}$cycloalkyl, which can be substituted one to three times with $C_1$-$C_8$alkyl and/or $C_1$-$C_8$alkoxy, $C_6$-$C_{24}$aryl, in particular phenyl or 1- or 2-naphthyl which can be substituted one to three times with $C_1$-$C_8$alkyl, $C_1$-$C_{25}$thioalkoxy, and/or $C_1$-$C_{25}$alkoxy, or pentafluorophenyl, wherein
$R^{106''}$ is $C_1$-$C_{50}$alkyl, preferably $C_4$-$C_{25}$alkyl,
$Ar^1$, $Ar^{1'}$, $Ar^2$, $Ar^{2'}$, $Ar^3$, $Ar^{3'}$, $Ar^4$ and $Ar^{4'}$ are independently of each other heteroaromatic, or aromatic rings, which optionally can be condensed and/or substituted, preferably

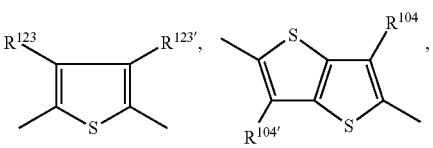

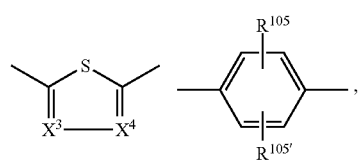

-continued

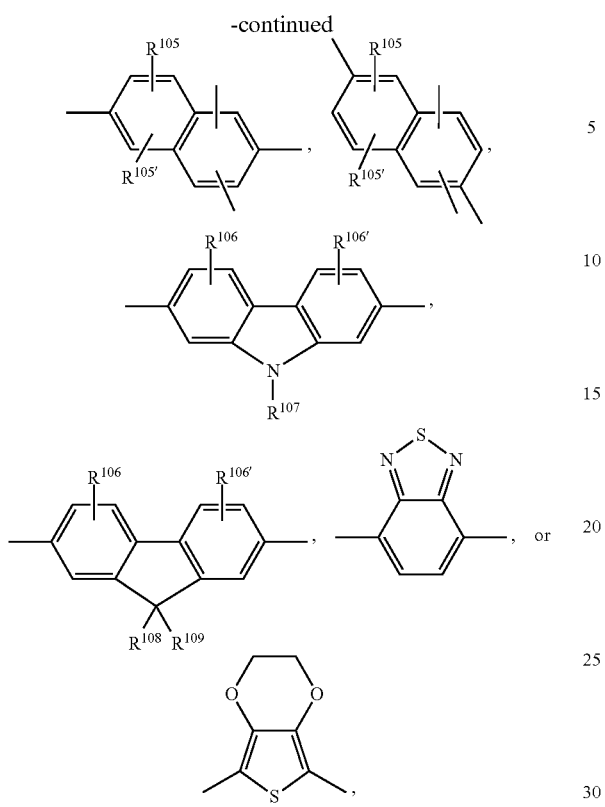

wherein
one of $X^3$ and $X^4$ is N and the other is $CR^{99}$,
  wherein $R^{99}$ is hydrogen, halogen, preferably F, or $C_1$-$C_{25}$alkyl, preferably a $C_4$-$C_{25}$alkyl, which may optionally be interrupted by one or more oxygen or sulphur atoms, $C_7$-$C_{25}$arylalkyl, or $C_1$-$C_{25}$alkoxy,
$R^{104}$, $R^{104'}$, $R^{123}$ and $R^{123'}$ are independently of each other hydrogen, halogen, preferably F, or $C_1$-$C_{25}$alkyl, preferably a $C_4$-$C_{25}$alkyl, which may optionally be interrupted by one or more oxygen or sulphur atoms, $C_7$-$C_{25}$arylalkyl, or $C_1$-$C_{25}$alkoxy,
$R^{105}$, $R^{105'}$, $R^{106}$ and $R^{106'}$ are independently of each other hydrogen, halogen, $C_1$-$C_{25}$alkyl, which may optionally be interrupted by one or more oxygen or sulphur atoms; $C_7$-$C_{25}$arylalkyl, or $C_1$-$C_{18}$alkoxy,
$R^{107}$ is $C_7$-$C_{25}$arylalkyl, $C_6$-$C_{18}$aryl; $C_6$-$C_{18}$aryl which is substituted by $C_1$-$C_{18}$alkyl, $C_1$-$C_{18}$perfluoroalkyl, or $C_1$-$C_{18}$alkoxy; $C_1$-$C_{18}$alkyl; $C_1$-$C_{18}$alkyl which is interrupted by —O—, or —S—; or —COOR$^{124}$;
  $R^{124}$ is $C_1$-$C_{25}$alkyl, preferably $C_4$-$C_{25}$alkyl, which may optionally be interrupted by one or more oxygen or sulphur atoms, $C_7$-$C_{25}$arylalkyl,
$R^{108}$ and $R^{109}$ are independently of each other H, $C_1$-$C_{25}$alkyl, $C_1$-$C_{25}$alkyl which is substituted by E' and/or interrupted by D', $C_7$-$C_{25}$arylalkyl, $C_6$-$C_{24}$aryl, $C_6$-$C_{24}$aryl which is substituted by G, $C_2$-$C_{20}$heteroaryl, $C_2$-$C_{20}$heteroaryl which is substituted by G, $C_2$-$C_{18}$alkenyl, $C_2$-$C_{18}$alkynyl, $C_1$-$C_{18}$alkoxy, $C_1$-$C_{18}$alkoxy which is substituted by E' and/or interrupted by D', or $C_7$-$C_{25}$aralkyl,
or
$R^{108}$ and $R^{109}$ together form a group of formula =$CR^{110}R^{111}$, wherein
  $R^{110}$ and $R^{111}$ are independently of each other H, $C_1$-$C_{18}$alkyl which is substituted by E' and/or interrupted by D', $C_6$-$C_{24}$aryl, $C_6$-$C_{24}$aryl which is substituted by G, or $C_2$-$C_{20}$heteroaryl, or $C_2$-$C_{20}$heteroaryl which is substituted by G, or
$R^{108}$ and $R^{109}$ together form a five or six membered ring, which optionally can be substituted by $C_1$-$C_{18}$alkyl, $C_1$-$C_{18}$alkyl which is substituted by E' and/or interrupted by D', $C_6$-$C_{24}$aryl, $C_6$-$C_{24}$aryl which is substituted by G, $C_2$-$C_{20}$heteroaryl, $C_2$-$C_{20}$heteroaryl which is substituted by G, $C_2$-$C_{18}$alkenyl, $C_2$-$C_{18}$alkynyl, $C_1$-$C_{18}$alkoxy, $C_1$-$C_{18}$alkoxy which is substituted by E' and/or interrupted by D', or $C_7$-$C_{25}$aralkyl, wherein
  D' is —CO—, —COO—, —S—, —O—, or —NR$^{112}$—,
  E' is $C_1$-$C_8$thioalkoxy, $C_1$-$C_8$alkoxy, CN, —NR$^{112}$R$^{113}$, —CONR$^{112}$R$^{113}$, or halogen,
  G is E', or $C_1$-$C_{18}$alkyl, and
  $R^{112}$ and $R^{113}$ are independently of each other H; $C_6$-$C_{18}$aryl; $C_6$-$C_{18}$aryl which is substituted by $C_1$-$C_{18}$alkyl, or $C_1$-$C_{18}$alkoxy; $C_1$-$C_{18}$alkyl; or $C_1$-$C_{18}$alkyl which is interrupted by —O— and B, D and E are independently of each other a group of formula

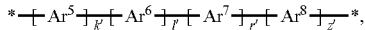

or a group of formula (24),
with the proviso that in case B, D and E are a group of formula (24), they are different from A, wherein
k' is 1,
l' is 0, or 1,
r' is 0, or 1,
z' is 0, or 1, and
$Ar^1$, $Ar^6$, $Ar^7$ and $Ar^8$ are independently of each other a group of formula

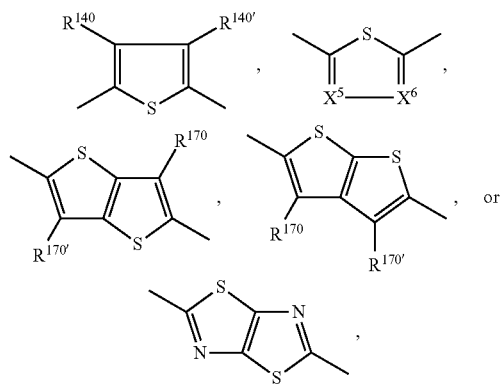

wherein one of $X^5$ and $X^6$ is N and the other is $CR^{140}$,
$R^{140}$, $R^{140'}$, $R^{170}$ and $R^{170'}$ are independently of each other H, or a $C_1$-$C_{25}$alkyl, preferably $C_6$-$C_{25}$alkyl, which may optionally be interrupted by one or more oxygen atoms.
Preferred polymers are described in WO2010/049321.

Ar¹ and Ar² are preferably

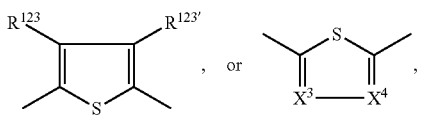

very preferably

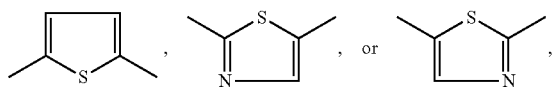

and most preferably

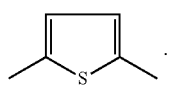

Ar², Ar²', Ar³, Ar³', Ar⁴ and Ar⁴' are preferably

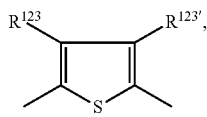

more preferably

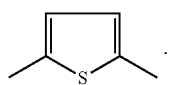

The group of formula

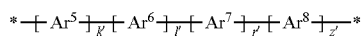

is preferably

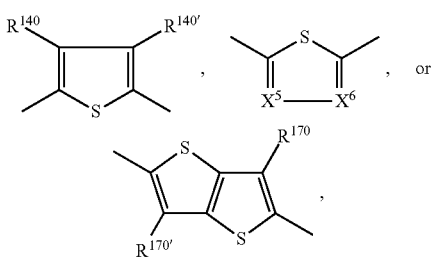

more preferably

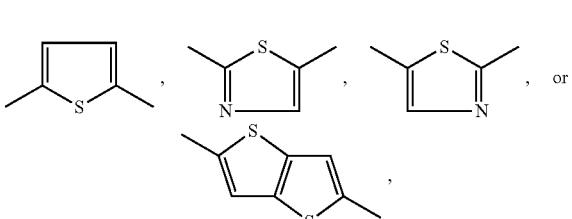

most preferred

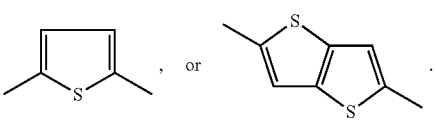

$R^{40}$ and $R^{41}$ are the same or different and are preferably selected from hydrogen, $C_1$-$C_{100}$alkyl, more preferably a $C_8$-$C_{36}$alkyl.

A is preferably selected from the group consisting of (24a)

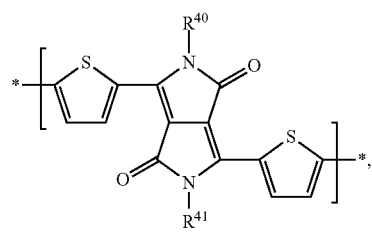

(24b)

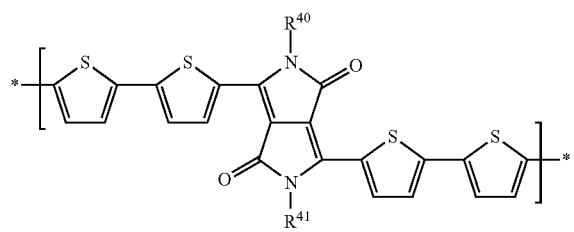

(24c)

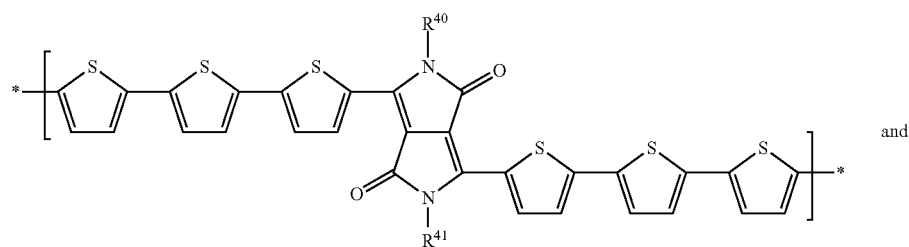

and (24d)

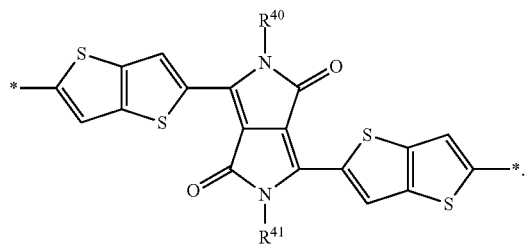

Examples of preferred DPP polymers comprising, preferably consisting essentially of, a polymer unit of formula (20) are shown below:

(20-1)

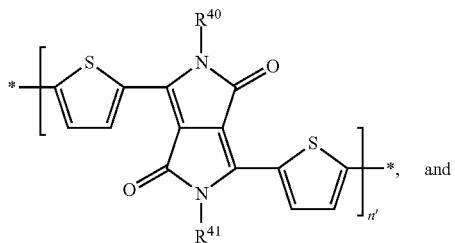

and (20-2)

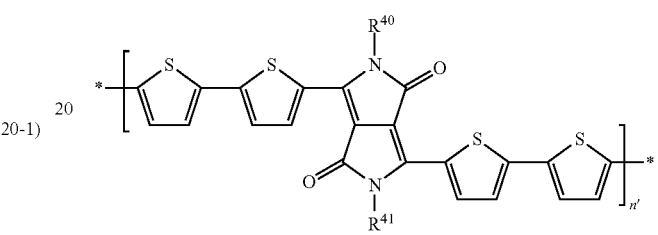

wherein
$R^{40}$ and $R^{41}$ are $C_1$-$C_{36}$alkyl, preferably $C_8$-$C_{36}$alkyl, and n' is 4 to 1000, preferably 4 to 200, more preferably 5 to 100.

Examples of preferred DPP polymers comprising, preferably consisting essentially of, a copolymer unit of formula (21) are shown below:

(21-1)

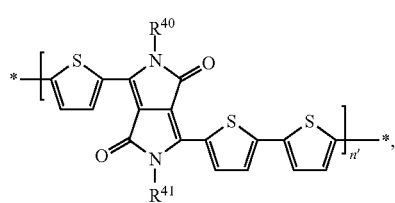

(21-2)

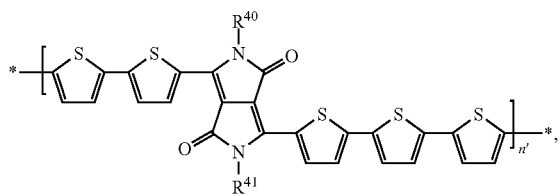

(21-3)

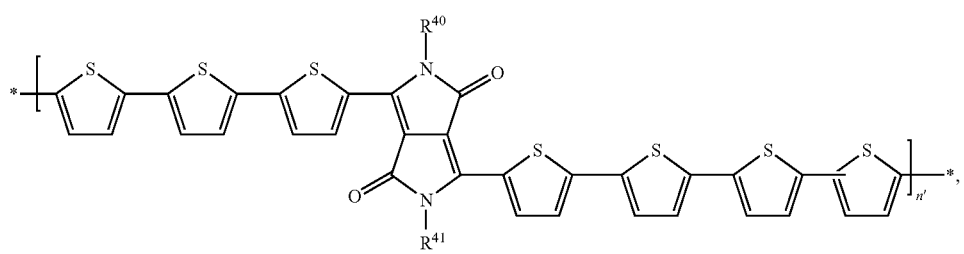

(21-4)

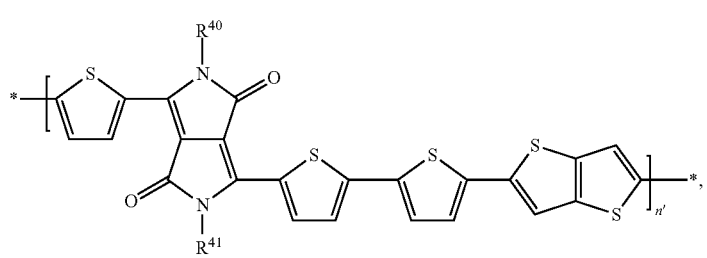

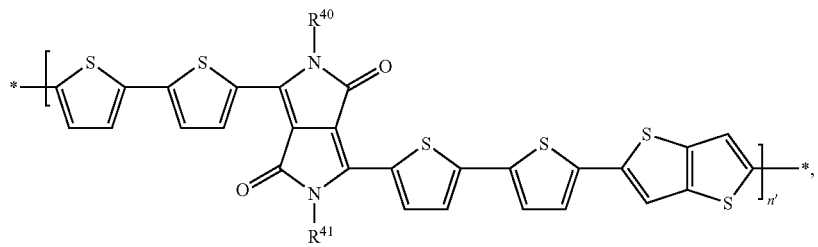
(21-5)
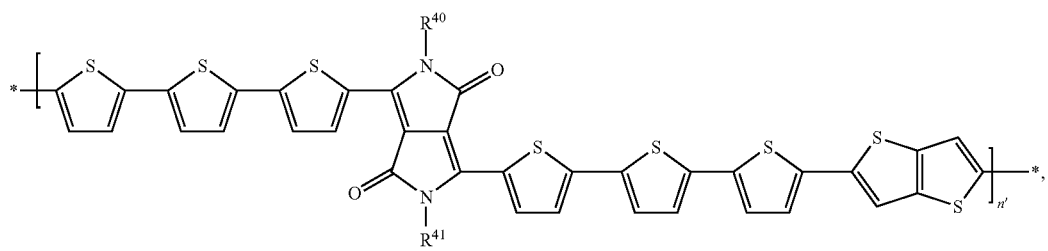
(21-6)
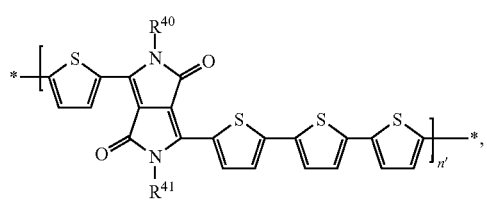
(21-7)
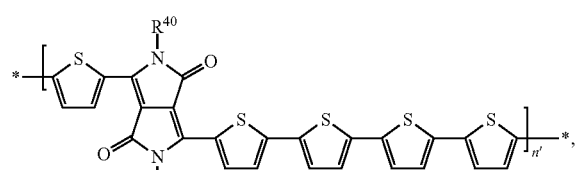
(21-8)
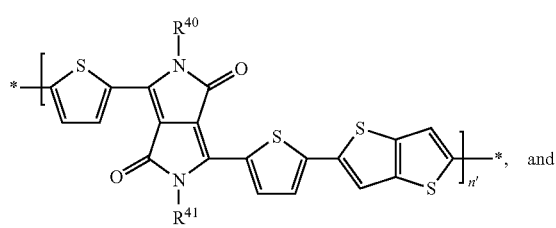
(21-9), and
(21-10)
wherein
$R^{40}$ and $R^{41}$ are $C_1$-$C_{36}$alkyl, preferably $C_8$-$C_{36}$alkyl, and n' is 4 to 1000, preferably 4 to 200, more preferably 5 to 100.
Examples of preferred DPP polymers comprising, preferably essentially consisting of, a copolymer unit of formula (22) are shown below:
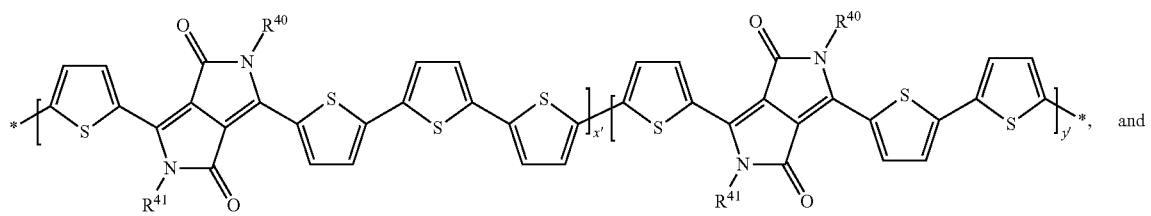
(22-1), and
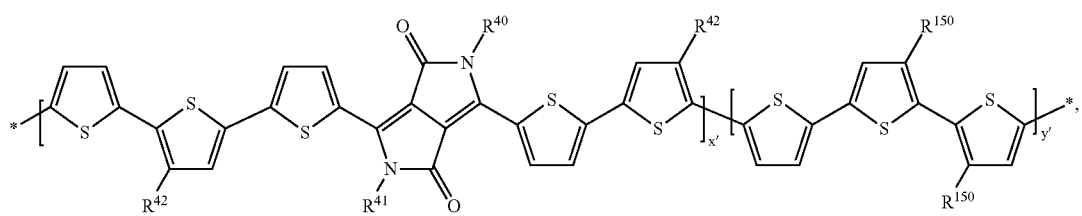
(22-2)

wherein
R$^{40}$ and R$^{41}$ are C$_1$-C$_{36}$alkyl, preferably C$_8$-C$_{36}$alkyl,
R$^{42}$ is C$_1$-C$_{18}$alkyl,
R$^{150}$ is a C$_4$-C$_{18}$alkyl group,
X'=0.995 to 0.005, preferably x'=0.4 to 0.9,
y'=0.005 to 0.995, preferably y'=0.6 to 0.1, and
x+y=1.

DPP Polymers comprising, preferably consisting essentially of, a copolymer unit of formula (22-1) are more preferred than DPP polymers comprising, preferably consisting essentially of, a copolymer unit of formula (22-2).

The DPP polymers preferably have a weight average molecular weight of 4,000 Daltons or greater, especially 4,000 to 2,000,000 Daltons, more preferably 10,000 to 1,000,000 and most preferably 10,000 to 100,000 Daltons.

DPP Polymers comprising, preferably consisting essentially of, a copolymer unit of formula (21-1) are particularly preferred. Reference is, for example made to example 1 of WO2010/049321:

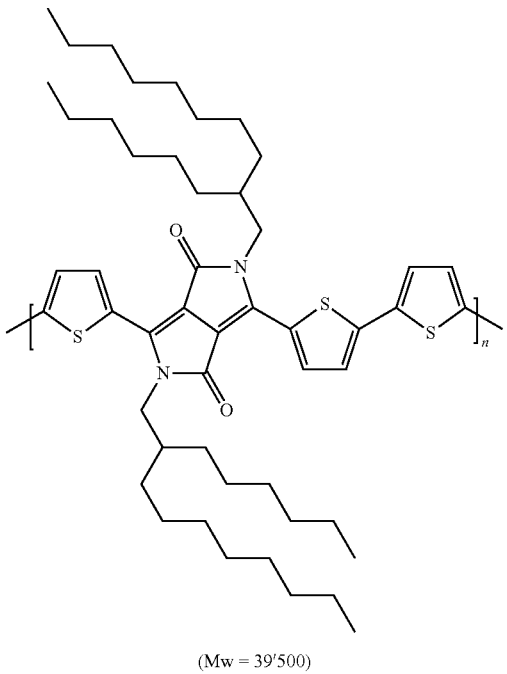

(Mw = 39'500)

The dielectric layer comprises a dielectric material. The dielectric material can be silicium/silicium dioxide, or, preferably, an organic polymer such as poly(methyl-methacrylate) (PMMA), poly(4-vinylphenol) (PVP), poly(vinyl alcohol) (PVA), anzocyclobutene (BCB), and polyimide (PI).

Preferably the layer comprising the polyimide B is the dielectric layer.

The substrate can be any suitable substrate such as glass, or a plastic substrate. Preferably the substrate is a plastic substrate such as polyethersulfone, polycarbonate, polysulfone, polyethylene terephthalate (PET) and polyethylene naphthalate (PEN). More preferably, the plastic substrate is a plastic foil.

Also part of the invention is a transistor obtainable by above process.

The advantage of the process for the preparation of a transistor, preferably an organic field effect transistor comprising a layer comprising polyimide B, for example as dielectric layer, is that all steps of the process, and in particular the step of forming the layer comprising the photocurable polyimide A, can be performed at a temperatures below 160° C., preferably below 150°, more preferably below 120° C.

Another advantage of the process of the present invention is that the photocurable polyimide A used is resistant to shrinkage.

Another advantage of the process of the present invention is that the photocurable polyimide A preferably has a glass temperature of at least 150° C., preferably of at least 170° C. Thus, photocurable polyimide A and polyimide B (derived from photocurable polyimide A) show a high chemical and thermal stability. As a consequence, the process of the present invention can be used to prepare, for example, an organic field effect transistor, wherein the layer comprising polyimide B is the dielectric layer, wherein the electrodes on top of the dielectric layer can be structured by an etching process.

Another advantage of the process of the present invention is that the photocurable polyimide A allows the formation of patterns.

Another advantage of the process of the present invention is that photocurable polyimide A is soluble in an organic solvent (solvent A). Preferably, it is possible to prepare a 2% by weight, more preferably a 5% by weight and most preferably a 8% by weight solution of photocurable polyimide A in the organic solvent. Thus, it is possible to apply photocurable polyimide A by solution processing techniques.

Another advantage of the process of the present invention is that the organic solvent used to dissolve photocurable polyimide A
(i) preferably has a boiling point (at ambient pressure) of below 160° C., preferably below 150° C., more preferably below 120° C., and thus can be can be removed by heat treatment at a temperature of below 120° C., preferably at a temperature in the range of 60 to 110° C., and
(ii) preferably does not dissolve suitable semiconducting materials such as diketopyrrolopyrol (DPP) thiophenes, and thus allows the formation of a smooth border when applying the photocurable polyimide A on a semiconducting layer comprising diketopyrrolopyrol (DPP) thiophenes.

Another advantage of the process of the present invention is that all steps of the process can be performed at ambient atmosphere, which means that no special precautions such as nitrogen atmosphere are necessary.

The advantage of the transistor of the present invention, preferably, wherein the transistor is an organic field effect transistor and wherein the layer comprising polyimide B is the dielectric layer and the semiconducting layer comprises a semiconducting material, for example a diketopyrrolopyrrole (DPP) thiophene polymer, is that the transistor shows a high mobility, a high Ion/Ioff ratio and a low gate leakage.

Figure 2:
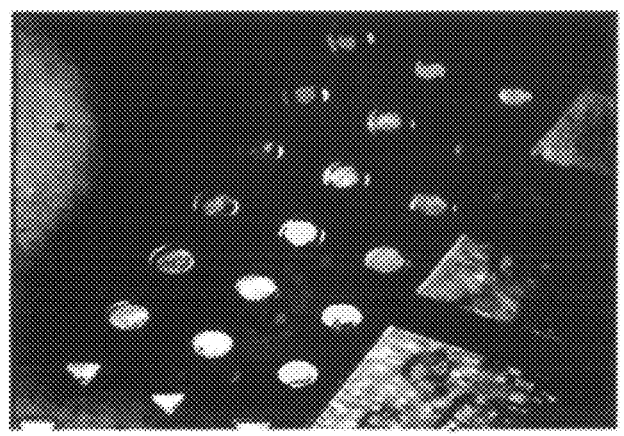

FIGS. 1 and 2 show pictures of the patterned layer of example 4 comprising a polyimide derived from polyimide A6.

Figure 3:
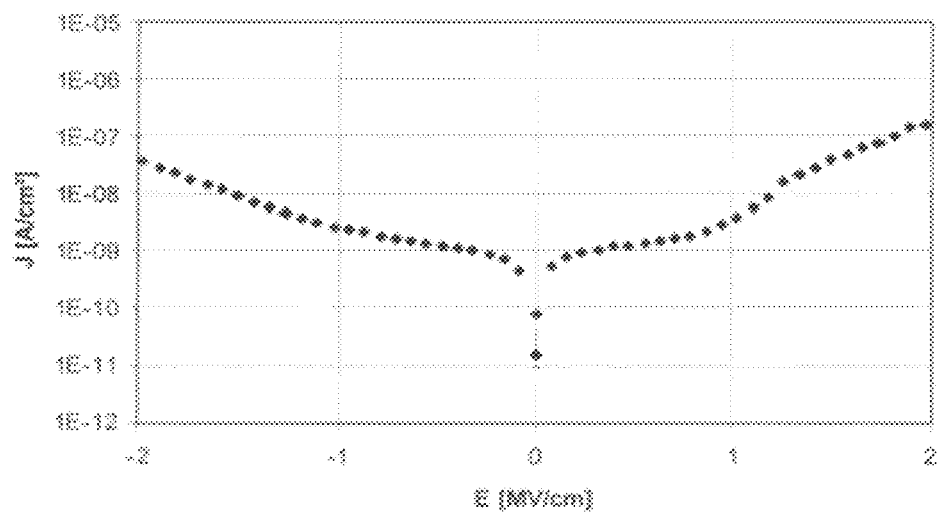

In FIG. 3 the leakage current density J in relation to the electric field E for the capacitor of example 5 comprising a polyimide derived from polyimide A1 is shown.

Figure 4:
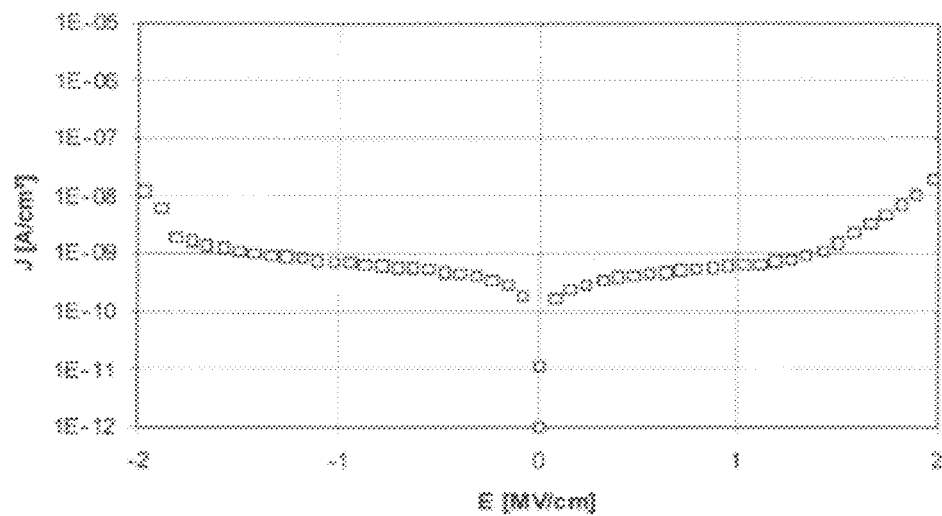

In FIG. 4 the leakage current density J in relation to the electric field E for the capacitor of example 5 comprising a polyimide derived from polyimide A2 is shown.

Figure 5:
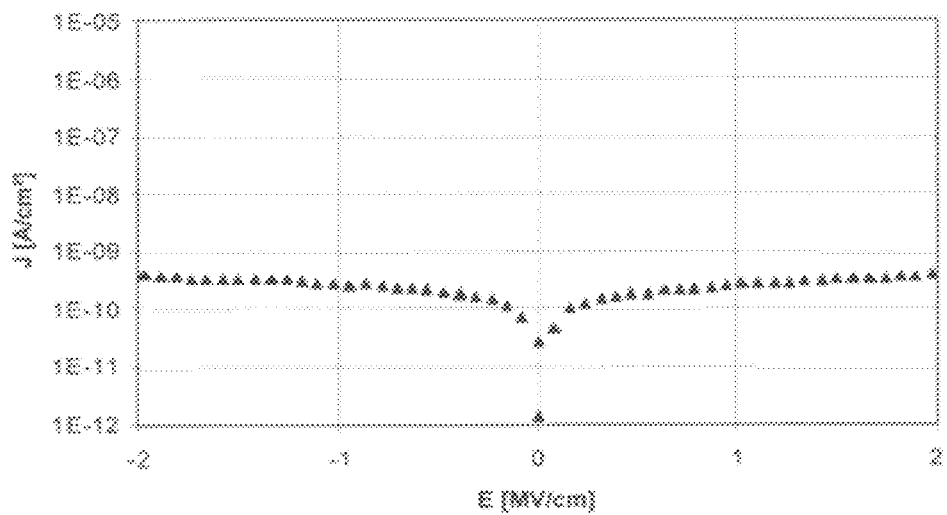

In FIG. 5 the leakage current density J in relation to the electric field E for the capacitor of example 6 comprising a polyimide derived from polyimide A6 is shown.

Figure 6:
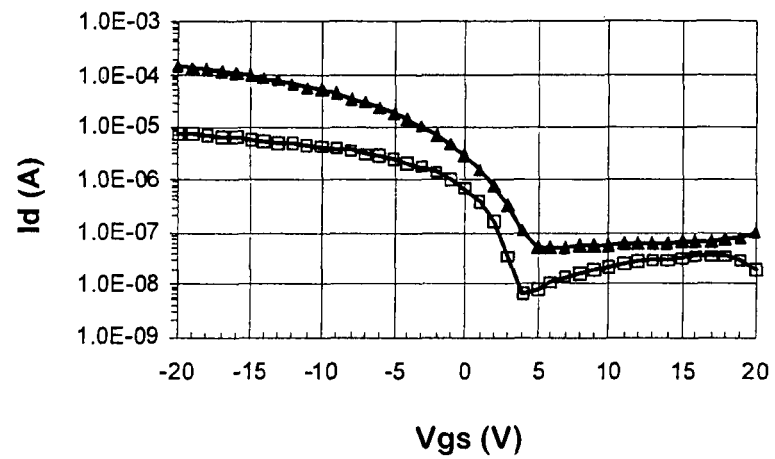

In FIG. 6 the drain current $I_{ds}$ in relation to the gate voltage $V_{gs}$ (transfer curve) for the top-gate, bottom-contact (TGBC) field effect transistor of example 8 comprising a polyimide derived from polyimide A1 at a source drain voltage $V_{sd}$ of −1 V (squares), respectively, −20 V (triangles) is shown.

Figure 7:
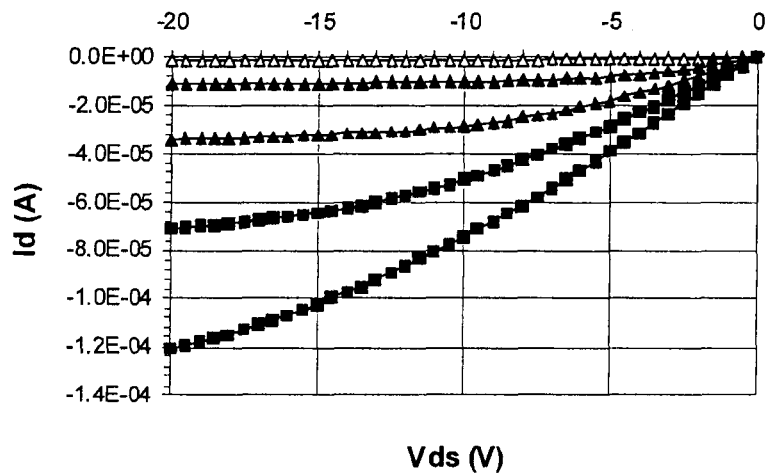

In FIG. 7 the drain current $I_{ds}$ in relation to the drain voltage $V_{ds}$ (output curve) for the top-gate, bottom-contact (TGBC) field effect transistor of example 8 comprising a polyimide derived from polyimide A1 at a gate voltage $V_{gs}$ of 0 V (first and top curve, light triangles), −5 V (second curve), −10 V (third curve), −15 V (fourth curve) and −20 V (fifth and bottom curve) is shown.

Figure 8:
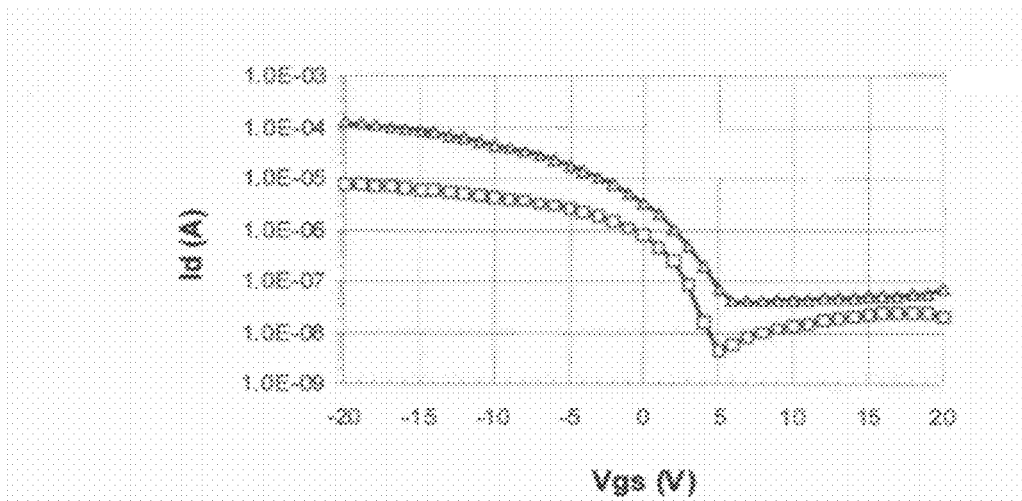

In FIG. 8 the drain current $I_{ds}$ in relation to the gate voltage $V_{gs}$ (transfer curve) for the top-gate, bottom-contact (TGBC) field effect transistor of example 9 comprising a polyimide derived from polyimide A2 at a source drain voltage $V_{sd}$ of −1 V (squares), respectively, −20 V (triangles) is shown.

Figure 9:
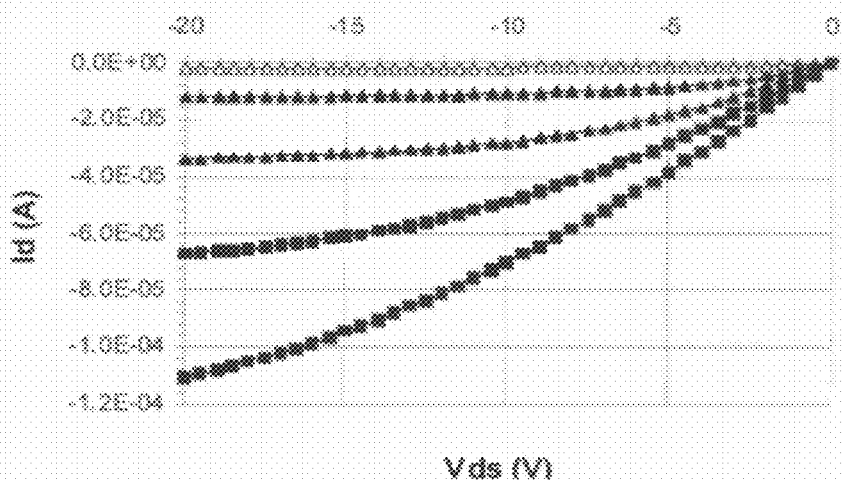

In FIG. 9 the drain current $I_{ds}$ in relation to the drain voltage $V_{ds}$ (output curve) for the top-gate, bottom-contact (TGBC) field effect transistor of example 9 comprising a polyimide derived from polyimide A2 at a gate voltage $V_{gs}$ of 0 V (first and top curve, light triangles), −5 V (second curve), −10 V (third curve), −15 V (fourth curve) and −20 V (fifth and bottom curve) is shown.

Figure 10:
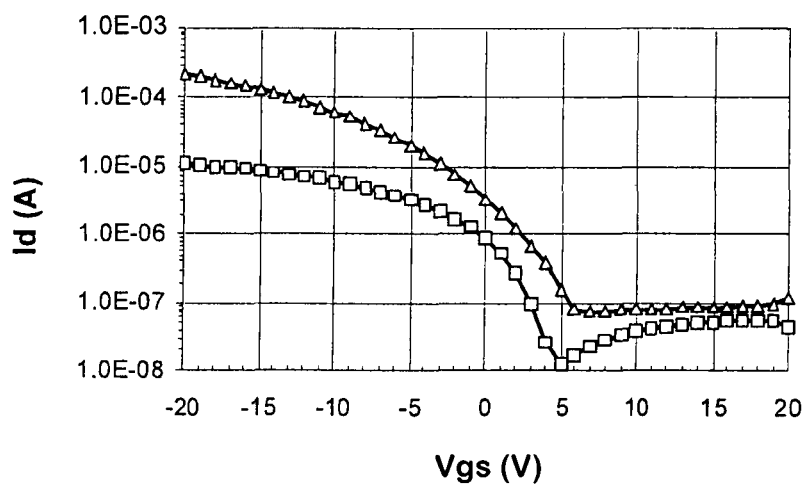

In FIG. 10 the drain current $I_{ds}$ in relation to the gate voltage $V_{gs}$ (transfer curve) for the top-gate, bottom-contact (TGBC) field effect transistor of example 10 comprising a polyimide derived from polyimide A6 at a source drain voltage $V_{sd}$ of −1 V (squares), respectively, −20 V (triangles) is shown.

Figure 11:
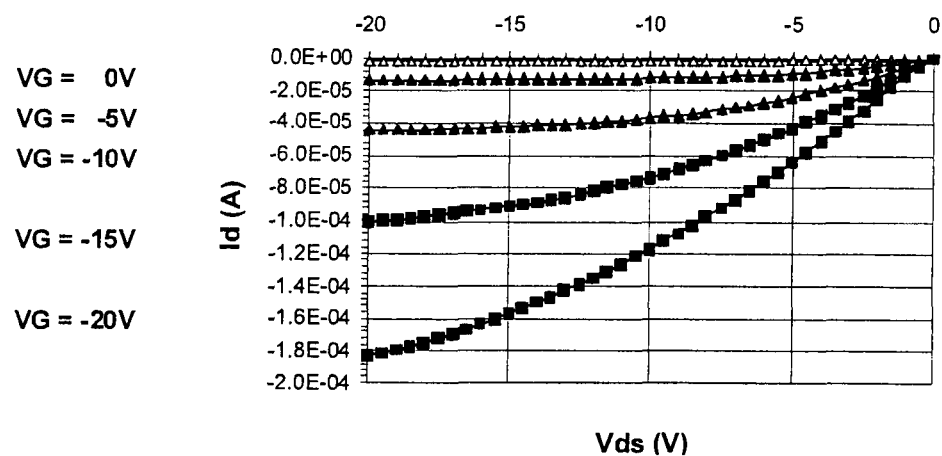

In FIG. 11 the drain current $I_{ds}$ in relation to the drain voltage $V_{ds}$ (output curve) for the top-gate, bottom-contact (TGBC) field effect transistor of example 10 comprising a polyimide derived from polyimide A6 at a gate voltage $V_{gs}$ of 0 V (first and top curve, light triangles), −5 V (second curve), −10 V (third curve), −15 V (fourth curve) and −20 V (fifth and bottom curve) is shown.

Figure 12:
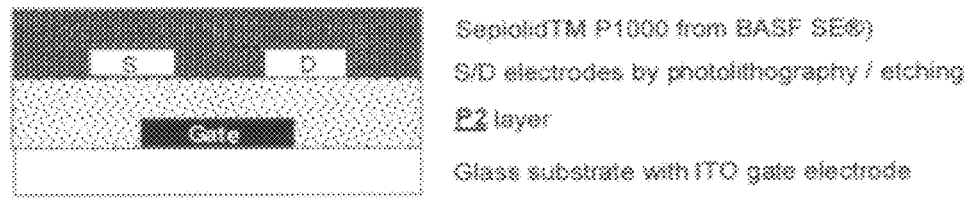

FIG. 12 shows the bottom-gate, bottom-contact (BGBC) field effect transistor of example 12 comprising a layer comprising the polyimide derived from polyimide A2 ("P2 layer" in FIG. 12).

Figure 13:
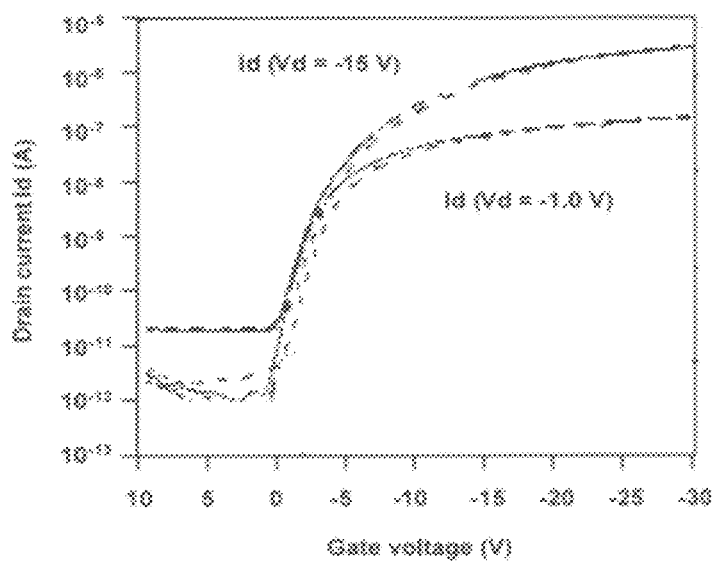

In FIG. 13 the drain current $I_{ds}$ in relation to the gate voltage $V_{gs}$ (transfer curve) for the bottom-gate, bottom-contact (BGBC) field effect transistor of example 12 comprising a polyimide derived from polyimide A2 at a source drain voltage $V_{sd}$ of −1 V, respectively, −15 V is shown.

Figure 14:
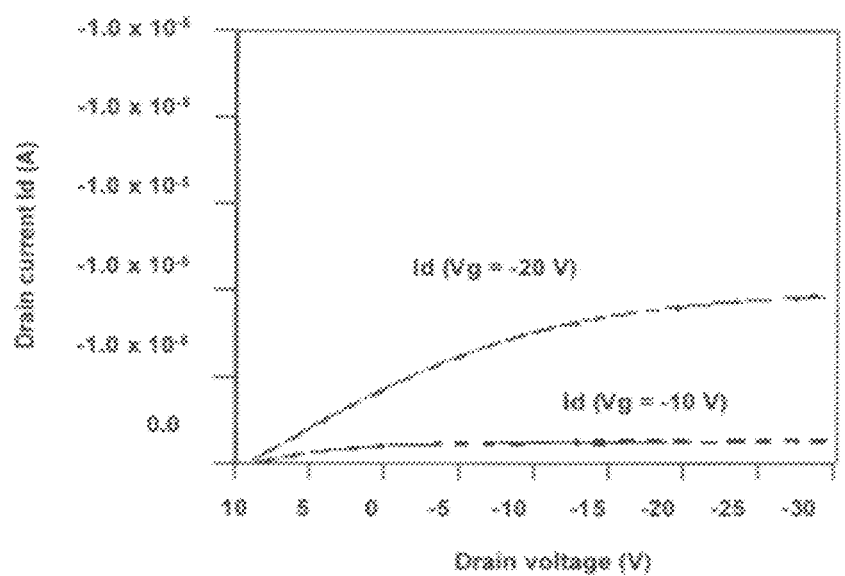

In FIG. 14 the drain current $I_{ds}$ in relation to the drain voltage $V_{ds}$ (output curve) for the bottom-gate, bottom-contact (BGBC) field effect transistor of example 12 comprising a polyimide derived from polyimide A2 at a gate voltage $V_{gs}$ of −10 V and −20 V is shown.

EXAMPLES

Example 1

Synthesis of Polyimides A1 to A8 (PI A1 to A8)

A 50 mL reactor with anchor stirrer and nitrogen inlet is charged with a solution of diamine (9.8 mmol) in N-methylpyrrolidone (NMP) (20 mL). Dianhydride (10 mmol) is added and the reaction mixture is stirred for 6 hours at room temperature. Butylamine (0.5 mL) is added and the reaction mixture is stirred for additional 2 hours. Acetic anhydride (3 mL) and triethylamine (1 mL) are added and the mixture is stirred for additional 16 hours. A blender beaker is filled with water (500 mL) and the reaction mixture is added slowly to the heavily blended water. The precipitated polyimide (PI) is collected by filtration, washed with water and re-suspended in water (100 mL) for 1 hour. The polyimide (PI) is again collected by filtration and washed with water and then dried in vacuum at 150° C. over night.

The diamine, respective the mixture of diamines, and the dianhydride, respectively the mixture of dianhydrides, can be derived from table 1.

TABLE 1

| PI A | Dianhydride | Diamine | Tg (PI A) [° C.] | BuAc/CP[h] [w/w] |
|------|-------------|---------|------------------|-------------------|
| PI A1 | BTDA[a] | MDMA[c] | 323 | 1:9 |
| PI A2 | BTDA[a] | MDEA[d] | 280 | 5:5 |
| PI A3 | BTDA[a] | MDEA[d]/DABM[e] 80/20 (mol/mol) | 275 | 3:7 |
| PI A4 | BTDA[a] | MDEA[d]/HMDA[f] 50/50 (mol/mol) | 200 | 5:5 |
| PI A5 | BTDA[a] | MDEA[d]/HMDA[f] 80/20 (mol/mol) | 240 | 4:6 |
| PI A6 | BTDA[a] | MDEA[d]/SiDA[g] 50/50 (mol/mol) | 180 | 9:1 |
| PI A7 | BTDA[a] | MDEA[d]/SiDA[g] 80/20 (mol/mol) | 220 | 7:3 |
| PI A8 | BTDA[a]/BPTDA[b] 50/50 (mol/mol) | MDEA[d] | 260 | 5:5 |

[a]BTDA = 3,3',4,4'-benzophenonetetracarboxylic dianhydride (1a),
[b]BPTDA = 3,3',4,4'-biphenyltetracarboxylic dianhydride (11a1),
[c]MDMA = 4,4'-methylene-bis(2,6-dimethylaniline),
[d]MDEA = 4,4'-methylenebis(2,6-diethylaniline) (5a5),
[e]DABM = 3,5-diaminobenzoic acid methyl ester (14a3),
[f]HMDA = hexamethylenediamine (16a1),
[g]SiDA = 1,3-bis-(aminopropyl)tetramethyldisiloxane of formula (16b1),
[h]Composition comprising 10% by weight of the polyimides A1 to A8 in the following solvents are prepared: 100% butyl acetate, 90% by weight butylacetate (BuAc) and 10% by weight cyclopentanone (CP), 80% by weight butylacetate and 20% by weight cyclopentanone, 70% by weight butylacetate and 30% by weight cyclopentanone, 60% by weight butylacetate and 40% by weight cyclopentanone, 50% by weight butylacetate and 50% by weight cyclopentanone, 40% by weight butylacetate and 60% by weight cyclopentanone, 30% by weight butylacetate and 70% by weight cyclopentanone, 20% by weight butylacetate and 80% by weight cyclopentanone, 10% by weight butylacetate and 90% by weight cyclopentanone. The solvent with the highest content of butyl acetate of the composition of the respective polyimide, which composition is a solution, is depicted in the column.

Example 2

Preparation of a Patterned Layer Comprising a Polyimide Derived from Polyimide A1

A 5% (weight/weight) solution of polyimide A1 of example 1 in N-methylpyrrolidone is filtered through a 0.45 µm filter and applied on a clean glass substrate by spin coating (2000 rpm, 45 seconds). The wet film is pre-baked at 100° C. for 60 seconds on a hot plate and then photocured with an LED lamp (365 nm, 10 mW/cm$^2$) through a mask for 45 seconds. The patterning is done by dipping the coated glass into N-methylpyrrolidone for 60 seconds, followed by drying under nitrogen and post-baking at 100° C. for 30 seconds. A patterned layer comprising a polyimide derived from polyimide A1 with a thickness of 400 nm is obtained.

Example 3

Preparation of a Patterned Layer Comprising a Polyimide Derived from Polyimide A2

A 6% (weight/weight) solution of polyimide A2 of example 1 in cyclopentanone is filtered through a 0.45 µm filter and applied on a clean glass substrate by spin coating (3000 rpm, 60 seconds). The wet film is pre-baked at 100° C. for 60 seconds on a hot plate and then photocured by irradiation with an LED lamp (365 nm, 10 mW/cm$^2$) through a mask for 45 seconds. The patterning is done by dipping the coated glass into N-methylpyrrolidone for 60 seconds, followed by drying under nitrogen and post-baking at 100° C. for 30 seconds. A patterned layer comprising a polyimide derived from polyimide A2 with a thickness of 600 nm is obtained.

Example 4

Preparation of a Patterned Layer Comprising a Polyimide Derived from Polyimide A6

A 13% (weight/weight) solution of polyimide A6 of example 1 in butyl acetate/cyclopentanone 80/20 (weight/weight) is filtered through a 0.45 µm filter and applied on a clean glass substrate by spin coating (5200 rpm, 60 seconds). The wet film is photocured with an LED lamp (365 nm, 10 mW/cm$^2$) through a mask for 3 minutes. The patterning is done by dipping the coated glass into cyclopentanone for 60 seconds, followed by drying under nitrogen. A patterned layer comprising a polyimide derived from polyimide A6 with a thickness of 610 nm is obtained.

FIGS. 1 and 2 show pictures of the patterned layer of example 4 comprising a polyimide derived from polyimide A6.

Example 5

Preparation of a Capacitor Comprising a Layer Comprising a Polyimide Derived from Polyimide A1, Respectively, a Polyimide Derived from Polyimide A2

A 6% (weight/weight) solution of polyimide A1, respectively, of polyimide A2 of example 1 in cyclopentanone is filtered through a 0.45 µm filter and applied on a clean glass substrate with indium tin oxide (ITO) electrodes by spin coating (4200 rpm, 60 seconds). The wet film is pre-baked at 100° C. for 60 seconds on a hot plate and then photocured with an LED lamp (365 nm, 10 mW/cm$^2$) through a mask for 3 minutes to obtain a 500 nm thick layer comprising a polyimide derived from polyimide A1, respectively, a polyimide derived from polyimide A2. Gold electrodes (area=0.785 mm$^2$) are then vacuum-deposited through a shadow mask on the layer comprising the polyimide derived from polyimide A1, respectively, the polyimide derived from polyimide A2 at <1×10$^{-6}$ Torr.

Example 6

Preparation of a Capacitor Comprising a Layer Comprising a Polyimide Derived from Polyimide A6

A 13% (weight/weight) solution of polyimide A6 of example 1 in butyl acetate/cyclopentanone 80/20 (weight/weight) is filtered through a 0.45 µm filter and applied on a clean glass substrate with indium tin oxide (ITO) electrodes by spin coating (4200 rpm, 60 seconds). The wet film is pre-baked at 100° C. for 60 seconds on a hot plate and then photocured with an LED lamp (365 nm, 10 mW/cm$^2$) through a mask for 3 minutes to obtain a 900 nm thick layer of a polyimide derived from polyimide A6. Gold electrodes (area=0.785 mm$^2$) are then vacuum-deposited through a shadow mask on the layer comprising the polyimide derived from polyimide A6 at <1×10$^{-6}$ Torr.

Example 7

Measurement of the Leakage Current Density J [A/cm$^2$] in Relation to the Electric Field E [MV/cm] for a Capacitor Comprising a Polyimide Derived from Polyimide A1, A2, Respectively, A6

The leakage current density J in relation to the electric field E for the capacitor comprising a polyimide derived from polyimide A1, A2, respectively, A6 of example 5, respectively, example 6 is determined as follows:

The J/E curves are calculated from IN curves knowing that E=V/d where d is the thickness of the dielectric film and that J=I/S where I is the leakage current measured between both electrodes and S is the surface of the gold electrode evaporated on top of the polyimide film. The IN curves are measured with an Agilent 4155C parameter analyzer in the range +100 V to −100V. The IN curves for positive voltages are measured from 0 to +100V in 2 V steps on one half of the electrodes. The IN curves for negative voltages are measured from 0 to −100V in −2 V steps on the other half of the electrodes. The source electrode is connected with the indium tin oxide (ITO) electrode and the gate electrode with the potential with the gold electrode.

In FIG. 3 the leakage current density J in relation to the electric field E for the capacitor of example 5 comprising a polyimide derived from polyimide A1 is shown.

In FIG. 4 the leakage current density J in relation to the electric field E for the capacitor of example 5 comprising a polyimide derived from polyimide A2 is shown.

In FIG. 5 the leakage current density J in relation to the electric field E for the capacitor of example 6 comprising a polyimide derived from polyimide A6 is shown.

As can be seen from FIGS. 1 to 3 the leakage current densities J of capacitors comprising a polyimide derived from polyimide A1, A2, respectively, A6 are very low, especially in the most relevant range of the electric field E, namely from −0.5 MV/cm to +0.5 MV/cm.

Example 8

Preparation of a Top-Gate, Bottom-Contact (TGBC) Field Effect Transistor Comprising a Layer Comprising a Polyimide Derived from Polyimide A1

Gold is sputtered onto poly(ethylene terephthalate) (PET) foil to form an approximately 40 nm thick film and then source/drain electrodes (channel length: 10 µm; channel width: 10 mm) are structured by photolithography process. A 0.75% (weight/weight) solution of Sepiolid™ P1000 from BASF SE® (a diketopyrrolopyrrole (DPP)-thiophene-polymer) in toluene is filtered through a 0.45 µm polytetrafluoroethylene (PTFE) filter and then applied by spin coating (1400 rpm, 10.000 rpm/s, 15 seconds). The wet Sepiolid™ P1000 film is dried at 100° C. on a hot plat for 30 seconds. A 6% (weight/weight) solution of polyimide A1 of example 1 in cyclopentanone is filtered through a 0.45 µm filter and then applied by spin-coating (7200 rpm, 10.000 rpm/s, 60 seconds). The layer comprising polyimide A1 is pre-baked at 100° C. on a hot plate for 60 seconds and then photocured using a Mask Aligner MA6 from SUSS (365 nm, 5.5 mW/cm$^2$) for 4 minutes to form a layer comprising a polyimide derived from polyimide A1. Gate electrodes of gold (thickness approximately 120 nm) are evaporated through a shadow mask on the layer comprising the polyimide derived from polyimide A1. The whole process is performed without a protective atmosphere.

Example 9

Preparation of a Top-Gate, Bottom-Contact (TGBC) Field Effect Transistor Comprising a Layer Comprising a Polyimide Derived from Polyimide A2

Gold is sputtered (thickness approximately 40 nm) onto poly(ethylene terephthalate) (PET) foil and then source/drain electrodes (channel length: 10 µM; channel width: 10 mm) are structured by photolithography process. A 0.75% (weight/weight) solution of Sepiolid™ P1000 from BASF SE® (a diketopyrrolopyrrole (DPP)-thiophene-polymer) in toluene is filtered through a 0.45 µm polytetrafluoroethylene (PTFE) filter and then applied by spin coating (1400 rpm, 10.000 rpm/s, 15 seconds). The wet Sepiolid™ P1000 film is dried at 100° C. on a hot plat for 30 seconds. A 6% (weight/weight) solution of polyimide A2 of example 1 in cyclopentanone is filtered through a 0.45 µM filter and then applied by spin-coating (4200 rpm, 10.000 rpm/s, 60 seconds). The layer comprising polyimide A2 is pre-baked at 100° C. on a hot plate for 60 seconds and then photocured using a Mask Aligner MA6 from SUSS (365 nm, 5.5 mW/cm$^2$) for 4 minutes to form a layer comprising a polyimide derived from polyimide A2. Gate electrodes of gold (thickness approximately 120 nm) are evaporated through a shadow mask on the layer comprising the polyimide derived from polyimide A2. The whole process is performed without a protective atmosphere.

Example 10

Preparation of a Top-Gate, Bottom-Contact (TGBC) Field Effect Transistor Comprising a Layer Comprising a Polyimide Derived from Polyimide A6

Gold is sputtered (thickness approximately 40 nm) onto poly(ethylene terephthalate) (PET) foil and then source/drain electrodes (channel length: 10 µm; channel width: 10 mm) are structured by photolithography process. A 0.75% (weight/weight) solution of Sepiolid™ P1000 from BASF SE® (a diketopyrrolopyrrole (DPP)-thiophene-polymer) in toluene is filtered through a 0.45 µm polytetrafluoroethylene (PTFE) filter and then applied by spin coating (1400 rpm, 10.000 rpm/s, 15 seconds). The wet Sepiolid™ P1000 is dried at 100° C. on a hot plat for 30 seconds. A 13% (weight/weight) solution of polyimide A6 of example 1 in butyl acetate/cyclopentanone 80/20 (weight/weight) is filtered through a 0.45 µm filter and then applied by spin-coating (5200 rpm, 10.000 rpm/s, 60 seconds). The layer comprising polyimide A1 is pre-baked at 100° C. on a hot plate for 30 seconds and then photocured using a Mask Aligner MA6 from SUSS (365 nm, 5.5 mW/cm$^2$) for 6 minutes to form a layer comprising a polyimide derived from polyimide A6. Gate electrodes of gold (thickness approximately 120 nm) are evaporated through a shadow mask on the layer comprising a polyimide derived from polyimide A6. The whole process is performed without a protective atmosphere.

Example 11

Measurement of the Characteristics of the Top-Gate, Bottom-Contact (TGBC) Field Effect Transistors of Examples 8 to 10

The characteristics of the top-gate, bottom-contact (TGBC) field effect transistors of examples 8 to 10 are measured with a Keithley 2612A semiconductor parameter analyzer.

In FIG. 6 the drain current $I_{ds}$ in relation to the gate voltage $V_{gs}$ (transfer curve) for the top-gate, bottom-contact (TGBC) field effect transistor of example 8 comprising a polyimide derived from polyimide A1 at a source drain voltage $V_{sd}$ of $-1$ V (squares), respectively, $-20$ V (triangles) is shown.

The top-gate, bottom-contact (TGBC) field effect transistor of example 8 comprising a polyimide derived from polyimide A1 shows a mobility of 0.16 cm$^2$/Vs (calculated for the saturation regime) and an Ion/Ioff ratio of 5900. The gate leakage at source drain voltage $V_{sd}$ of 30 V is about 3 orders of magnitudes below the source drain current $I_{sd}$.

In FIG. 7 the drain current $I_{ds}$ in relation to the drain voltage $V_{ds}$ (output curve) for the top-gate, bottom-contact (TGBC) field effect transistor of example 8 comprising a polyimide derived from polyimide A1 at a gate voltage $V_{gs}$ of 0 V (first and top curve, light triangles), $-5$ V (second curve), $-10$ V (third curve), $-15$ V (fourth curve) and $-20$ V (fifth and bottom curve) is shown.

In FIG. 8 the drain current $I_{ds}$ in relation to the gate voltage $V_{gs}$ (transfer curve) for the top-gate, bottom-contact (TGBC) field effect transistor of example 9 comprising a polyimide derived from polyimide A2 at a source drain voltage $V_{sd}$ of $-1$ V (squares), respectively, $-20$ V (triangles) is shown.

The top-gate, bottom-contact (TGBC) field effect transistor of example 9 comprising a polyimide derived from polyimide A2 shows a mobility of 0.11 cm$^2$/Vs (calculated for the saturation regime) and an Ion/Ioff ratio of 4600. The gate leakage at source drain voltage $V_{sd}$ of 30 V is about 3 orders of magnitudes below the source drain current $I_{sd}$.

In FIG. 9 the drain current $I_{ds}$ in relation to the drain voltage $V_{ds}$ (output curve) for the top-gate, bottom-contact (TGBC) field effect transistor of example 9 comprising a polyimide derived from polyimide A2 at a gate voltage $V_{gs}$ of 0 V (first and top curve, light triangles), $-5$ V (second curve), $-10$ V (third curve), $-15$ V (fourth curve) and $-20$ V (fifth and bottom curve) is shown.

In FIG. 10 the drain current $I_{ds}$ in relation to the gate voltage $V_{gs}$ (transfer curve) for the top-gate, bottom-contact (TGBC) field effect transistor of example 10 comprising a polyimide derived from polyimide A6 at a source drain voltage $V_{sd}$ of $-1$ V (squares), respectively, $-20$ V (triangles) is shown.

The top-gate, bottom-contact (TGBC) field effect transistor of example 10 comprising a polyimide derived from polyimide A6 shows a mobility of 0.22 cm$^2$/Vs (calculated for the saturation regime) and an Ion/Ioff ratio of 2400. The gate leakage at source drain voltage $V_{sd}$ of 30 V is about 2 orders of magnitudes below the source drain current $I_{sd}$.

In FIG. 11 the drain current $I_{ds}$ in relation to the drain voltage $V_{ds}$ (output curve) for the top-gate, bottom-contact (TGBC) field effect transistor of example 10 comprising a polyimide derived from polyimide A6 at a gate voltage $V_{gs}$ of 0 V (first and top curve, light triangles), $-5$ V (second curve), $-10$ V (third curve), $-15$ V (fourth curve) and $-20$ V (fifth and bottom curve) is shown.

Example 12

Preparation of a Bottom-Gate, Bottom-Contact (BGBC) Field Effect Transistor Comprising a Layer Comprising a Polyimide Derived from Polyimide A2

A 6% (weight/weight) solution of polyimide A2 of example 1 in cyclopentanone is applied on a clean glass substrate with an indium tin oxide (ITO) (75 nm thick) gate electrode by spin coating (3000 rpm, 60 seconds). The wet film is pre-baked at 100° C. for 60 seconds on a hot plate and then photocured using an LED lamp (365 nm, 10 mW/cm$^2$) for 45 seconds to form a layer comprising the polyimide derived from polyimide A2. A 4N gold layer (120 nm thick) is applied on the layer comprising the polyimide derived from polyimide A2. Drain/source electrodes are structured by a photolithographic process (using a commercial positive photoresist, etching the bare gold after development with KI/I$_2$ and removing the remaining photoresist material with acetone) to form 24 gold electrodes with various geometries (10, respectively, 20 μm channel length). Finally a 0.5% (weight/weight) solution of Sepiolid™ P1000 from BASF SE® (a diketopyrrolopyrrole (DPP)-thiophene-polymer) in o-xylene is applied by spin coating (3000 rpm, 50 seconds).

FIG. 12 shows the bottom-gate, bottom-contact (BGBC) field effect transistor of example 12 comprising a layer comprising the polyimide derived from polyimide A2 ("P2 layer" in FIG. 12).

Example 13

Measurement of the Characteristics of the Bottom-Gate, Bottom-Contact (BGBC) Field Effect Transistor of Example 12

The characteristics of the bottom-gate, bottom-contact (BGBC) field effect transistors of example 12 are measured with a Keithley 2612A semiconductor parameter analyzer.

In FIG. 13 the drain current $I_{ds}$ in relation to the gate voltage $V_{gs}$ (transfer curve) for the bottom-gate, bottom-contact (BGBC) field effect transistor of example 12 comprising a polyimide derived from polyimide A2 at a source drain voltage $V_{sd}$ of −1 V, respectively, −15 V is shown.

In FIG. 14 the drain current $I_{ds}$ in relation to the drain voltage $V_{ds}$ (output curve) for the bottom-gate, bottom-contact (BGBC) field effect transistor of example 12 comprising a polyimide derived from polyimide A2 at a gate voltage $V_{gs}$ of −10 V and −20 V is shown.

The invention claimed is:

1. A process for the preparation of an organic field-effect transistor (OFET) on a substrate, which organic field-effect transistor comprises a layer, which layer comprises polyimide B, and an additional layer comprising a semiconducting material, wherein the semiconducting material comprises units having a diketopyrrolopyrrole group (DPP polymer),
wherein the process comprises
i) forming a layer comprising photocurable polyimide A by applying photocurable polyimide A as a solution in an organic solvent A on the layer comprising the semiconducting material, wherein the organic solvent A is a mixture of butyl acetate and cyclopentanone in a weight ratio of butyl acetate/cyclopentanone is at least from 99/1 to 20/80,
ii) irradiating the layer comprising photocurable polyimide A with light of a wavelength of >=360 nm to form the layer comprising polyimide B.

2. The process of claim 1, wherein the photocurable polyimide A is a polyimide which is obtainable by reacting a mixture of reactants, which mixture of reactants comprise at least one dianhydride A, and at least one diamine A, wherein the dianhydride A is a dianhydride carrying at least one photosensitive group and the diamine A is a diamine carrying at least one crosslinkable group.

3. The process of claim 2, wherein the dianhydride A which is a dianhyride carrying at least one photosensitive group, is selected from the group consisting of

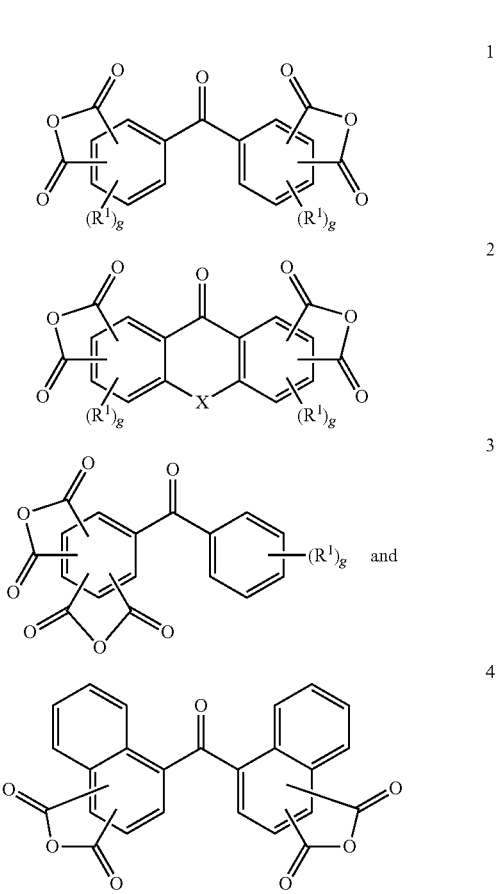

wherein
$R^1$ is $C_{1-10}$-alkyl, $C_{1-10}$-haloalkyl, halogen or phenyl
g is 0, 1, 2 or 3,
X is a direct bond, $CH_2$, O, S or C(O).

4. The process of claim 2, wherein the diamine A, which is a diamine carrying at least one crosslinkable group, is selected from the group consisting of (i) a diamine of formula

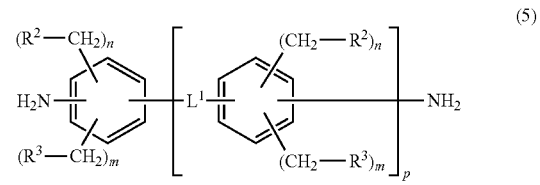

wherein
$R^2$, $R^3$ are the same or different and are H, $C_{1-10}$-alkyl or $C_{4-8}$-cycloalkyl,
n is 1, 2, 3 or 4
m is 0, 1, 2 or 3
provided n+m<=4,
p is 0, 1, 2, 3 or 4,
$L^1$ is O, S, $C_{1-10}$-alkylene, phenylene or C(O)
wherein $C_{1-10}$-alkylene can be optionally substituted with one or more $C_{1-10}$-alkyl, $C_{1-10}$-haloalkyl and/or $C_{4-8}$-cycloalkyl, or interrupted by O or S, (ii) a diamine of formula

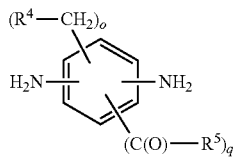
(6)

wherein
$R^4$ is H, $C_{1-10}$-alkyl or $C_{4-8}$-cycloalkyl
$R^5$ is O—$C_{1-10}$-alkyl, O—$C_{1-10}$-alkylene-O—$C_{1-10}$-alkyl, O—$C_{1-10}$-alkylene-N($C_{1-10}$-alkyl)$_2$, N($C_{1-10}$-alkyl)$_2$, O-phenyl, W, O—$C_{1-10}$-alkylene-W, O-phenylene-W, N($R^6$)($C_{1-10}$-alkylene-W) or N($R^6$)(phenylene-W), wherein
$R^6$ is H, $C_{1-10}$-alkyl, $C_{4-10}$-cycloalkyl or $C_{1-10}$-alkylene-W,
W is O—$C_{2-10}$-alkenyl, N($R^7$)($C_{2-10}$-alkenyl), O—C(O)—$CR^8$=$CH_2$, N($R^7$)(C(O)—$CR^8$=$CH_2$), or

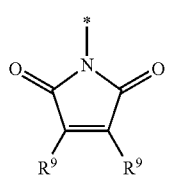
(7)

wherein
$R^7$ is H, $C_{1-10}$-alkyl, $C_{4-8}$-cycloalkyl, $C_{2-10}$-alkenyl or C(O)—$CR^8$=$CH_2$,
$R^8$ is H, $C_{1-10}$-alkyl or $C_{4-8}$-cycloalkyl,
$R^9$ is H, $C_{1-10}$-alkyl or $C_{4-8}$-cycloalkyl
q is 1, 2, 3 or 4
o is 0, 1, 2, 3
q+o<=4,
in case o is 0, $R^5$ is W, O—$C_{1-10}$-alkylene-W, O-phenylene-W, N($R^6$)($C_{1-10}$-alkylene-W) or N($R^6$)(phenylene-W),
wherein $C_{1-10}$-alkylene, can be optionally substituted with one or more $C_{1-10}$-alkyl, $C_{1-10}$-haloalkyl, and/or $C_{4-8}$-cycloalkyl, or interrupted by 0 or S,
and
(iii) a diamine of formula wherein
$R^{10}$ and $R^{11}$ are the same or different and are H, $C_{1-10}$-alkyl or $C_{4-8}$-cycloalkyl
$R^{13}$ and $R^{14}$ are the same and different and are $C_{1-10}$-alkyl, $C_{1-10}$-haloalkyl, $C_{4-8}$-cycloalkyl, $C_{2-10}$-alkenyl, $C_{4-10}$-cycloalkenyl or phenyl,
$L^2$ is $C_{1-10}$-alkylene or phenylene
r is 0, 1, 2, 3 or 4
s is 0, 1, 2, 3 or 4
r+s<=4
in case both r and s are 0 then at least one of $R^{13}$ and $R^{14}$ is $C_{2-10}$-alkenyl or $C_{4-10}$-cycloalkenyl,
t is 0 or an integer from 0 to 50,
u is 0 or 1
wherein $C_{1-10}$-alkylene can be optionally substituted with one or more $C_{1-10}$-alkyl, $C_{1-10}$-haloalkyl and/or $C_{4-8}$-cycloalkyl, or interrupted by O or S.

5. The process of claim 2, wherein the diamine A, which is a diamine carrying at least one crosslinkable group, is a diamine of formula

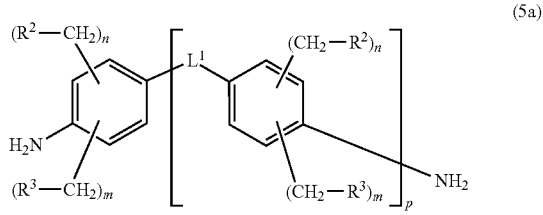
(5a)

wherein
$R^2$, $R^3$ are the same or different and are H, $C_{1-10}$-alkyl or $C_{4-8}$-cycloalkyl,
n is 1, 2, 3 or 4
m is 0, 1, 2 or 3
provided n+m<=4,
p is 0, 1, 2, 3 or 4,
$L^1$ is O, S, $C_{1-10}$-alkylene, phenylene or C(O)
wherein $C_{1-10}$-alkylene can be optionally substituted with one or more $C_{1-10}$-alkyl, $C_{1-10}$-haloalkyl and/or $C_{4-8}$-cycloalkyl, or interrupted by O or S.

6. The process of claim 2, wherein the mixture of reactants comprises at least one dianhydride B and/or at least one diamine B, wherein the dianhydride B is a dianhydride carrying no photosensitive group, and the diamine B is a diamine carrying no crosslinkable group.

7. The process of claim 6, wherein dianhydride B, which is a dianhydride carrying no photosensitive group, is selected from the group consisting of

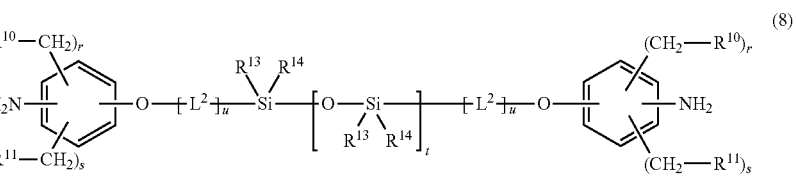
(8)

(ii) a diamine of formula

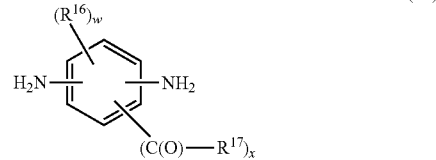

(14)

wherein
$R^{16}$ is halogen or $O-_{C1-10}$-alkyl
$R^{17}$ is $O-C_{1-10}$-alkyl, $O-C_{1-10}$-alkylene-$O-C_{1-10}$-alkyl, O-phenyl, $O-C_{1-10}$-alkylene-$N(C_{1-10}$-alkyl$)_2$ or $N(C_{1-10}$-alkyl$)_2$
w is 0, 1, 2 or 3
x is 1, 2, 3, 4
w+x<=4,
wherein $C_{1-10}$-alkylene can be optionally substituted with one or more $C_{1-10}$-alkyl, $C_{1-10}$-haloalkyl and/or $C_{4-8}$-cycloalkyl, or interrupted by O or S,
(iii) a diamine of formula

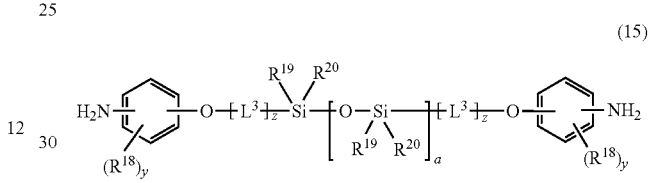

(15)

wherein
$R^{18}$ is halogen or $O-C_{1-10}$-alkyl,
$R^{19}$ and $R^{20}$ are the same and different and are $C_{1-10}$-alkyl, $C_{1-10}$-haloalkyl or $C_{4-8}$-cycloalkyl or phenyl,
$L^3$ is $C_{1-10}$-alkylene or phenylene
y is 0, 1, 2, 3 or 4
z is 0 or 1
a is 0 or an integer from 1 to 50,
wherein $C_{1-10}$-alkylene can be optionally substituted with one or more $C_{1-10}$-alkyl, $C_{1-10}$-haloalkyl and/or $C_{4-8}$-cycloalkyl, or interrupted by O or S,
and
(iv) a diamine of formula

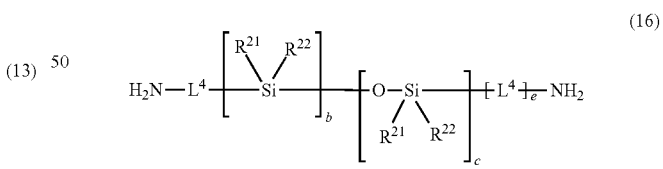

(16)

wherein
$R^{21}$ and $R^{22}$ are the same and different and are $C_{1-10}$-alkyl, $C_{1-10}$-haloalkyl or $C_{4-8}$-cycloalkyl,
$L^4$ is $C_{1-10}$-alkylene, $C_{4-8}$-cycloalkylene or $C_{4-8}$-cycloalkylene-$Z-C_{4-8}$-cycloalkylene,
wherein Z is $C_{1-10}$-alkylene, S, O or CO
b is 0 or 1
c is 0 or an integer from 1 to 50,
e is 0 or 1
wherein $C_{1-10}$-alkylene can be optionally substituted with one or more $C_{1-10}$-alkyl, $C_{1-10}$-haloalkyl and/or $C_{4-8}$-cycloalkyl, or interrupted by O or S.

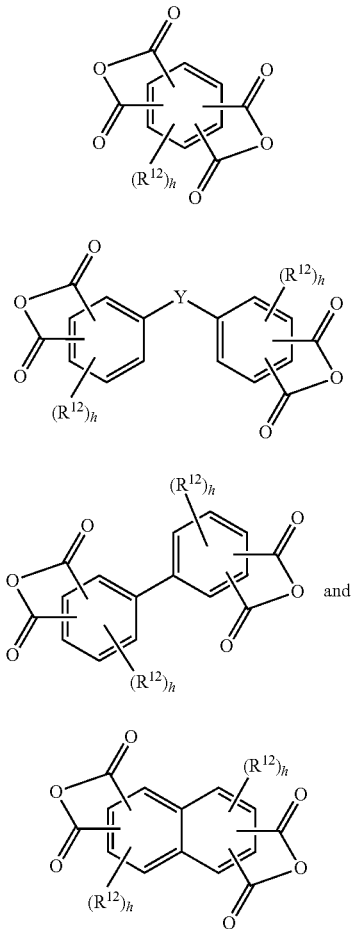

wherein
$R^{12}$ is $C_{1-10}$-alkyl, $C_{1-10}$-haloalkyl, halogen or phenyl
h is 0, 1, 2 or 3,
Y is a $C_{1-10}$-alkylene, O or S.

8. The process of claim 6, wherein the diamine B, which is a diamine carrying no crosslinkable group, is selected from the group consisting of (i) a diamine of formula

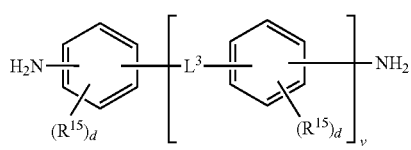

(13)

wherein
$R^{15}$ is halogen or $O-C_{1-10}$-alkyl,
d is 0, 1, 2, 3 or 4
v is 0, 1, 2, 3 or 4,
$L^3$ is a direct bond, O, S, $C_{1-10}$-alkylene or CO,
wherein $C_{1-10}$-alkylene can be optionally substituted with one or more $C_{1-10}$-alkyl, $C_{1-10}$-haloalkyl and/or $C_{4-8}$-cycloalkyl, or interrupted by 0 or S, 9. The process of claim 1, wherein the DPP polymer comprises a unit selected from the group consisting of
a polymer unit of formula

 (20)

a copolymer unit of formula

 (21)

a copolymer unit of formula

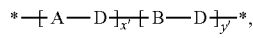 (22)

and
A copolymer unit of formula

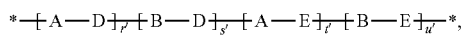 (23)

wherein
n' is 4 to 1000
x' is 0.995 to 0.005,
y' is 0.005 to 0.995, and
x'+y'=1;
r' is 0.985 to 0.005,
s' is 0.005 to 0.985,
t' is 0.005 to 0.985,
u' is 0.005 to 0.985, and
r'+s'+t'+u'=1;
A is a group of formula (24)

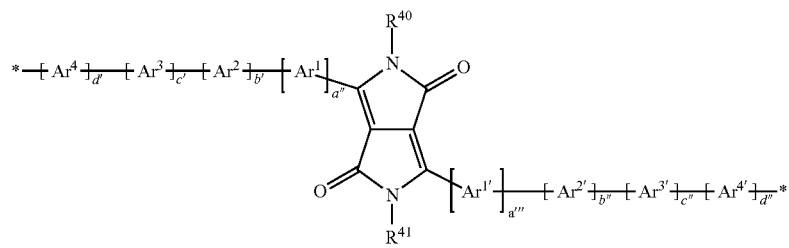

wherein
a" is 1, 2, or 3,
a'" is 0, 1, 2, or 3,
b' is 0, 1, 2, or 3,
b" is 0, 1, 2, or 3,
c' is 0, 1, 2, or 3,
c" is 0, 1, 2, or 3,
d' is 0, 1, 2, or 3,
d" is 0, 1, 2, or 3,
with the proviso that b" is not 0, if a'" is 0;
$R^{40}$ and $R^{41}$ are the same or different and are selected from the group consisting of hydrogen, $C_{1-100}$alkyl, —COOR$^{106"}$, $C_{1-100}$alkyl which is substituted with one or more halogen, hydroxyl, nitro, —CN, or $C_6$-$C_{18}$aryl and/or interrupted by —O—, —COO—, —OCO—, or —S—; $C_7$-$C_{100}$arylalkyl, carbamoyl, $C_5$-$C_{12}$cycloalkyl, which can be substituted one to three times with $C_1$-$C_8$alkyl and/or $C_1$-$C_8$alkoxy, $C_6$-$C_{24}$aryl, which can be substituted one to three times with $C_1$-$C_8$alkyl, $C_1$-$C_{25}$thioalkoxy, and/or $C_1$-$C_{25}$alkoxy, or pentafluorophenyl, wherein
$R^{106"}$ is $C_1$-$C_{50}$alkyl,
$Ar^1$, $Ar^{1'}$, $Ar^2$, $Ar^{2'}$, $Ar^3$, $Ar^{3'}$, $Ar^4$ and $Ar^{4'}$ are independently of each other heteroaromatic, or aromatic rings, which optionally can be condensed and/or substituted

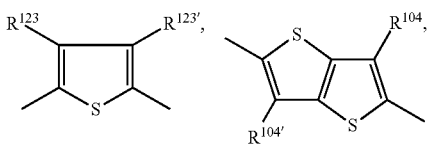

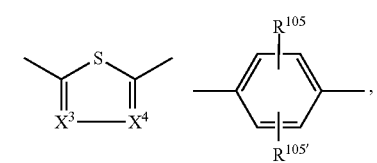

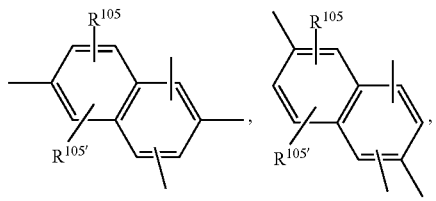

-continued

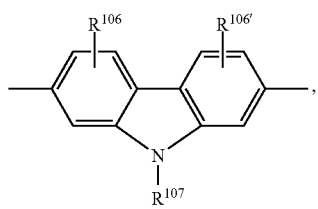

-continued

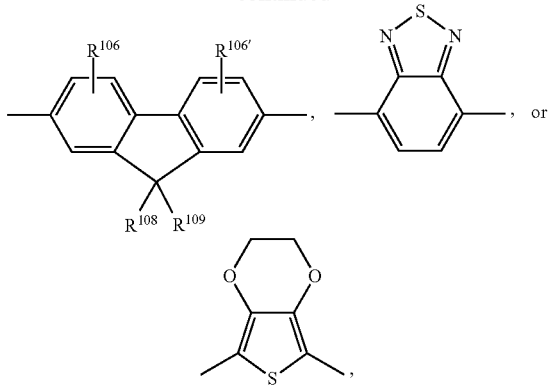

wherein
one of $X^3$ and $X^4$ is N and the other is $CR^{99}$,
  wherein $R^{99}$ is hydrogen, halogen, or $C_1$-$C_{25}$alkyl, which may optionally be interrupted by one or more oxygen or sulphur atoms, $C_7$-$C_{25}$arylalkyl, or $C_1$-$C_{25}$alkoxy,
$R^{104}$, $R^{104'}$, $R^{123}$ and $R^{123'}$ are independently of each other hydrogen, halogen, or $C_1$-$C_{25}$alkyl, which may optionally be interrupted by one or more oxygen or sulphur atoms, $C_7$-$C_{25}$arylalkyl, or $C_1$-$C_{25}$alkoxy,
$R^{105}$, $R^{105'}$, $R^{106}$ and $R^{106'}$ are independently of each other hydrogen, halogen, $C_1$-$C_{25}$alkyl, which may optionally be interrupted by one or more oxygen or sulphur atoms; $C_7$-$C_{25}$arylalkyl, or $C_1$-$C_{18}$alkoxy,
$R^{107}$ is $C_7$-$C_{25}$arylalkyl, $C_6$-$C_{18}$aryl; $C_6$-$C_{18}$aryl which is substituted by $C_1$-$C_{18}$alkyl, $C_1$-$C_{18}$perfluoroalkyl, or $C_{1-18}$alkoxy; $C_1$-$C_{18}$alkyl; $C_1$-$C_{18}$alkyl which is interrupted by —O—, or —S—; or —$COOR^{124}$;
$R^{124}$ is $C_1$-$C_{25}$alkyl which may optionally be interrupted by one or more oxygen or sulphur atoms, $C_7$-$C_{25}$arylalkyl,
$R^{108}$ and $R^{109}$ are independently of each other H, $C_1$-$C_{25}$alkyl, $C_1$-$C_{25}$alkyl which is substituted by E' and/or interrupted by D', $C_7$-$C_{25}$arylalkyl, $C_6$-$C_{24}$aryl, $C_6$-$C_{24}$aryl which is substituted by G, $C_2$-$C_{20}$heteroaryl, $C_2$-$C_{20}$heteroaryl which is substituted by G, $C_2$-$C_{18}$alkenyl, $C_2$-$C_{18}$alkynyl, $C_{1-18}$alkoxy, $C_1$-$C_{18}$alkoxy which is substituted by E' and/or interrupted by D', or $C_7$-$C_{25}$aralkyl,
or
$R^{108}$ and $R^{109}$ together form a group of formula =$CR^{110}R^{111}$, wherein
  $R^{110}$ and $R^{111}$ are independently of each other H, $C_1$-$C_{18}$alkyl, $C_1$-$C_{18}$alkyl which is substituted by E' and/or interrupted by D', $C_6$-$C_{24}$aryl, $C_6$-$C_{24}$aryl which is substituted by G, or $C_2$-$C_{20}$heteroaryl, or $C_2$-$C_{20}$heteroaryl which is substituted by G,
or
$R^{108}$ and $R^{109}$ together form a five or six membered ring, which optionally can be substituted by $C_1$-$C_{18}$alkyl, $C_1$-$C_{18}$alkyl which is substituted by E' and/or interrupted by D', $C_6$-$C_{24}$aryl, $C_6$-$C_{24}$aryl which is substituted by G, $C_2$-$C_{20}$heteroaryl, $C_2$-$C_{20}$heteroaryl which is substituted by G, $C_2$-$C_{18}$alkenyl, $C_2$-$C_{18}$alkynyl, $C_1$-$C_{18}$alkoxy, $C_1$-$C_{18}$alkoxy which is substituted by E' and/or interrupted by D', or $C_7$-$C_{25}$aralkyl, wherein
  D' is —CO—, —COO—, —S—, —O—, or —$NR^{112}$—,
  E' is $C_1$-$C_8$thioalkoxy, $C_1$-$C_8$alkoxy, CN, —$NR^{112}R^{113}$, —$CONR^{112}R^{113}$, or halogen,
  G is E', or $C_1$-$C_{18}$alkyl, and
  $R^{112}$ and $R^{113}$ are independently of each other H; $C_6$-$C_{18}$aryl; $C_6$-$C_{18}$aryl which is substituted by $C_1$-$C_{18}$alkyl, or $C_1$-$C_{18}$alkoxy; $C_1$-$C_{18}$alkyl; or $C_1$-$C_{18}$alkyl which is interrupted by —O— and
B, D and E are independently of each other a group of formula

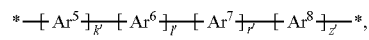

or a group of formula (24),
with the proviso that in case B, D and E are a group of formula (24), they are different from A, wherein
k' is 1,
l' is 0, or 1,
r' is 0, or 1,
z' is 0, or 1, and
$Ar^5$, $Ar^6$, $Ar^7$ and $Ar^8$ are independently of each other a group of formula

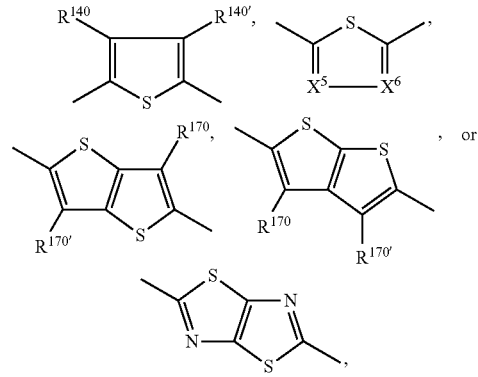

wherein one of $X^5$ and $X^6$ is N and the other is $CR^{140}$,
  $R^{140}$, $R^{140'}$, $R^{170}$ and $R^{170'}$ are independently of each other H, or a $C_1$-$C_{25}$alkyl, which may optionally be interrupted by one or more oxygen atoms.

10. An organic field-effect transistor on a substrate obtainable by the process of claim 1.

* * * * *